(12) United States Patent
Matsuoka et al.

(10) Patent No.: US 8,817,225 B2
(45) Date of Patent: Aug. 26, 2014

(54) COATING AND DEVELOPING APPARATUS AND METHOD, AND STORAGE MEDIUM

(75) Inventors: Nobuaki Matsuoka, Koshi (JP); Akira Miyata, Koshi (JP); Shinichi Hayashi, Koshi (JP); Suguru Enokida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 516 days.

(21) Appl. No.: 13/182,572

(22) Filed: Jul. 14, 2011

(65) Prior Publication Data

US 2012/0015307 A1 Jan. 19, 2012

(30) Foreign Application Priority Data

Jul. 16, 2010 (JP) ................... 2010-161987

(51) Int. Cl.
*G03B 27/32* (2006.01)
*G03D 5/00* (2006.01)
*B05C 11/02* (2006.01)

(52) U.S. Cl.
USPC ............... 355/27; 396/611; 118/52; 355/77

(58) Field of Classification Search
CPC .............. H01L 21/67712; H01L 21/67196; H01L 21/6719; H01L 21/67184; H01L 21/67178; H01L 21/67173; H01L 21/67161; H01L 21/67682; H01L 21/00; H01L 21/02002; H01L 21/67; H01L 21/67011; H01L 21/67155; G03F 7/7075; G03F 7/16; G03F 7/162
USPC ......... 355/27, 77; 396/611; 118/52, 302, 695; 430/325
See application file for complete search history.

(56) References Cited

U.S. PATENT DOCUMENTS 7,661,894 B2 2/2010 Matsuoka et al.
2012/0156626 A1* 6/2012 Ishida et al. ............ 430/325

FOREIGN PATENT DOCUMENTS

JP 2007-115831 A1 5/2007

* cited by examiner

*Primary Examiner* — Peter B Kim
*Assistant Examiner* — Michelle Iacoletti
(74) *Attorney, Agent, or Firm* — Burr & Brown, PLLC

(57) ABSTRACT

In one embodiment, a coating and developing apparatus is provided with transfer units, provided between a stack of early-stage processing unit blocks and a stack of later-stage processing unit blocks to transfer a substrate between the transport mechanisms of laterally-adjacent unit blocks, and a vertically-movable auxiliary transfer mechanism for transporting a substrate between the transfer units. A stack of first developing unit blocks is stacked on the stack of early-stage processing unit blocks, and a stack of second developing unit blocks is stacked on the stack of later-stage processing unit blocks.

13 Claims, 16 Drawing Sheets

COATING AND DEVELOPING APPARATUS AND METHOD, AND STORAGE MEDIUM

CROSS-REFERENCE TO RELATED APPLICATION

This application is based on and claims the benefit of priority to Japanese Patent Application No. 2010-161987 filed on Jul. 16, 2010, the entire contents of which are incorporated herein by reference.

TECHNICAL FIELD

The present disclosure relates to a coating and developing apparatus, a coating and developing method and a storage medium for applying a resist to a substrate and developing the resist after exposure.

BACKGROUND ART

A semiconductor manufacturing process includes a photolithography process comprising applying a photoresist (hereinafter simply referred to as a resist) to a surface of a semiconductor wafer (hereinafter simply referred to as a wafer), exposing the resist in a predetermined pattern, and developing the exposed resist to form a resist pattern. A coating and developing apparatus for forming such a resist pattern includes a processing block having processing modules for performing various types of processing of a wafer.

The processing block is comprised of a stack of unit blocks for forming various types of coating films (e.g. resist film) and unit blocks for performing developing processing, as described e.g. in Japanese Patent Laid-Open Publication No. 2007-115831. A wafer undergoes processing in various processing modules, provided in each unit block, according to a predetermined order.

In order to meet recent demands for finer resist patterns, increased yield, etc., processing modules provided in a processing block are becoming diversified. For example, besides a resist film-forming module for applying a resist onto a substrate, such as a wafer, and a developing module for supplying a developer to the substrate, a processing block may also be provide with a back surface cleaning module for cleaning the back surface of the substrate after resist coating and an upper film-forming liquid processing module for supplying a chemical solution onto the resist film to further form a film.

A demand also exists for the production of a wide variety of semiconductor products by means of a coating and developing apparatus. For example, a coating and developing apparatus is being studied which incorporates a positive resist-coating module and a negative resist-coating module as well as a positive resist-developing module and a negative resist-developing module. With an increased number of diverse processing modules provided in a processing block of a coating and developing apparatus, there is a problem of how to reduce the increase in the footprint of the apparatus.

Stacking a plurality of unit blocks in a coating and developing apparatus, as described above, is effective for reducing the footprint of the apparatus. However, because a wafer is transported sequentially to the unit blocks, the operation of the entire coating and developing apparatus must be stopped when an abnormality occurs in one processing module or one unit block, or when performing maintenance of one processing module or one unit block. This significantly lowers the operation efficiency of the apparatus.

SUMMARY OF DISCLOSURE

The present disclosure provides a technique which can reduce the lowering of the throughput of a coating and developing apparatus upon the occurrence of an abnormality in a unit block or upon maintenance on it and, in addition, enables small installation area of a processing block.

In one embodiment, there is provided a coating and developing apparatus including a carrier block, a processing block, and an interface block connectable to an exposure apparatus, said coating and developing apparatus being configured to transfer a substrate, which has been carried by a carrier into the carrier block, to the processing block, form at least two coating films, including a resist film, on the substrate in the processing block, send the substrate to the exposure apparatus via the interface block, develop the substrate after exposure, which has returned via the interface block, in the processing block, and transfer the substrate to the carrier block, wherein: the processing block includes a plurality of early-stage processing unit blocks vertically stacked on each other, a plurality of later-stage processing unit blocks vertically stacked on each other and provided on an interface block side of a stack of the early-stage processing unit blocks such that each of the later-stage processing unit blocks is disposed laterally adjacent to respective ones of the early-stage processing unit blocks, a plurality of first developing unit blocks vertically stacked on each other and vertically stacked on the stack of the early-stage processing unit blocks, and a plurality of second developing unit blocks vertically stacked on each other and vertically stacked on a stack of the later-stage processing unit blocks such that each of the second developing unit blocks is disposed laterally adjacent to respective ones of the first developing unit blocks; each of the early-stage processing unit blocks has a plurality of processing modules, including an antireflection film-forming module as a liquid processing module for forming a lower antireflection film, a resist film-forming module as a liquid processing module for forming a resist film on the lower antireflection film, and heating modules for heating the substrate, and is provided with a transport mechanism that moves on a linear transport passage, extending from the carrier block side to the interface block side, to transport the substrate between the processing modules; each of the later-stage processing unit blocks has a plurality of processing modules, including an upper film-forming module as a liquid processing module for forming an upper film on the resist film, .a cleaning module for cleaning the substrate before exposure, and heating modules for heating the substrate, and is provided with a transport mechanism that moves on a linear transport passage, extending from the carrier block side to the interface block side, to transport the substrate between the processing modules; each of the first developing unit blocks has a plurality of processing modules, including developing modules for supplying a developer to the substrate, and heating modules for heating the substrate, and is provided with a transport mechanism that moves on a linear transport passage, extending from the carrier block side to the interface block side, to transport the substrate between the processing modules; each of the second developing unit blocks has a plurality of processing modules, including developing modules for supplying a developer to the substrate, and heating modules for heating the substrate, and is provided with a transport mechanism that moves on a linear transport passage, extending from the carrier block side to the interface block side, to transport the substrate between the processing modules; said coating and developing apparatus further includes: a plurality of first transfer units, each of which is disposed between the laterally adjacent early-stage processing unit block and later-stage processing unit block to transfer a substrate therebetween; a plurality of second transfer units, each of which is disposed between the laterally adjacent first and second developing unit blocks to transfer a substrate therebetween; a vertically movable auxiliary transfer mechanism for transferring a substrate between the first transfer units and between the second transfer units; a plurality of third transfer units, each of which is provided on the carrier block side of respective ones of the early-stage processing unit blocks and the first developing unit blocks, for transferring a substrate to the transport mechanism of the associated early-stage processing unit block or for transferring a substrate from the transport mechanism of the associated first developing unit block; a first transfer mechanism for transferring a substrate to distribute substrates from the carrier to the third transfer units associated with the early-stage processing unit blocks, and for transferring a substrate to return substrates from third transfer units associated with the developing unit blocks to the carrier; and a second transfer mechanism for receiving a substrate before exposure which has been processed in the processing block, and for transferring a substrate to distribute substrates after exposure to the second developing unit blocks.

In another embodiment, there is provided a coating and developing method, to be carried out by using the aforementioned coating and developing apparatus, upon occurrence of failure in a particular one of the early-stage processing unit blocks or upon maintenance on it, the method including: forming a lower antireflection film and a resist film on a substrate by the early-stage processing unit block other than the particular early-stage processing unit block; subsequently transporting the substrate by the auxiliary transfer mechanism to the later-stage processing unit blocks disposed laterally adjacent to the particular early-stage processing unit block; and subsequently forming an upper film on the substrate and cleaning the substrate in the later-stage processing unit block to which the substrate is transported.

In yet another embodiment, there is provided a coating and developing method, to be carried out by using the aforementioned coating and developing apparatus, upon occurrence of failure in a particular one of the latter-stage processing unit blocks or upon maintenance on it, the method including: forming a lower antireflection film and a resist film on a substrate in the early-stage processing unit block disposed laterally adjacent to the particular later-stage processing unit block; subsequently transporting the substrate by the auxiliary transfer mechanism to the later-stage processing unit block other than the particular later-stage processing unit block; and subsequently forming an upper film on the substrate and cleaning the substrate in the later-stage processing unit block to which the substrate is transported.

In yet another embodiment, there is provided a non-transitory storage medium in which a computer program for use in a coating and developing apparatus is stored, said computer program being for executing the foregoing coating and developing method.

DESCRIPTION OF THE PREFERRED EMBODIMENTS

Figure 1:
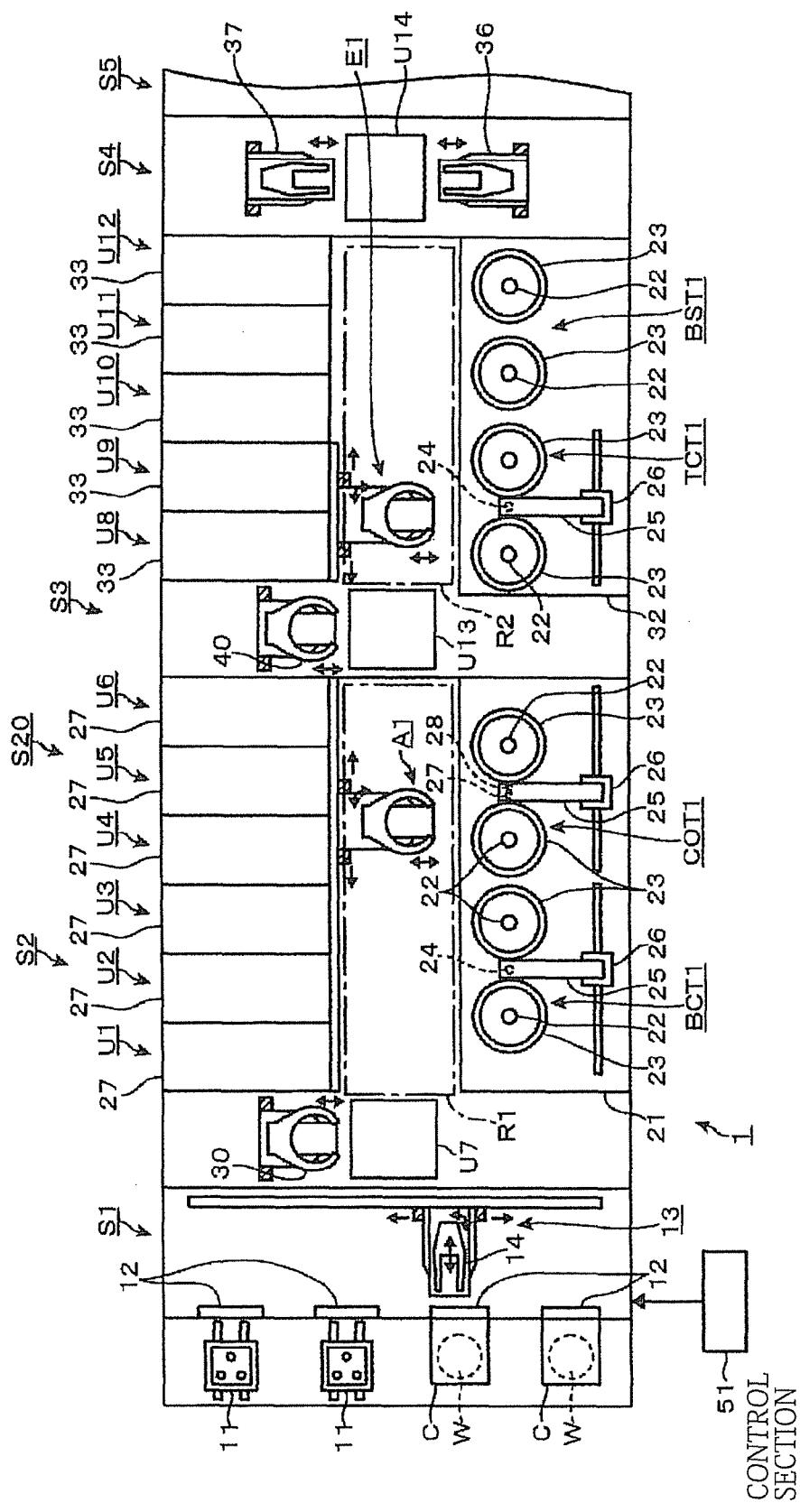
FIG. 1 is a plan view of a coating and developing apparatus in one embodiment.
Figure 2:
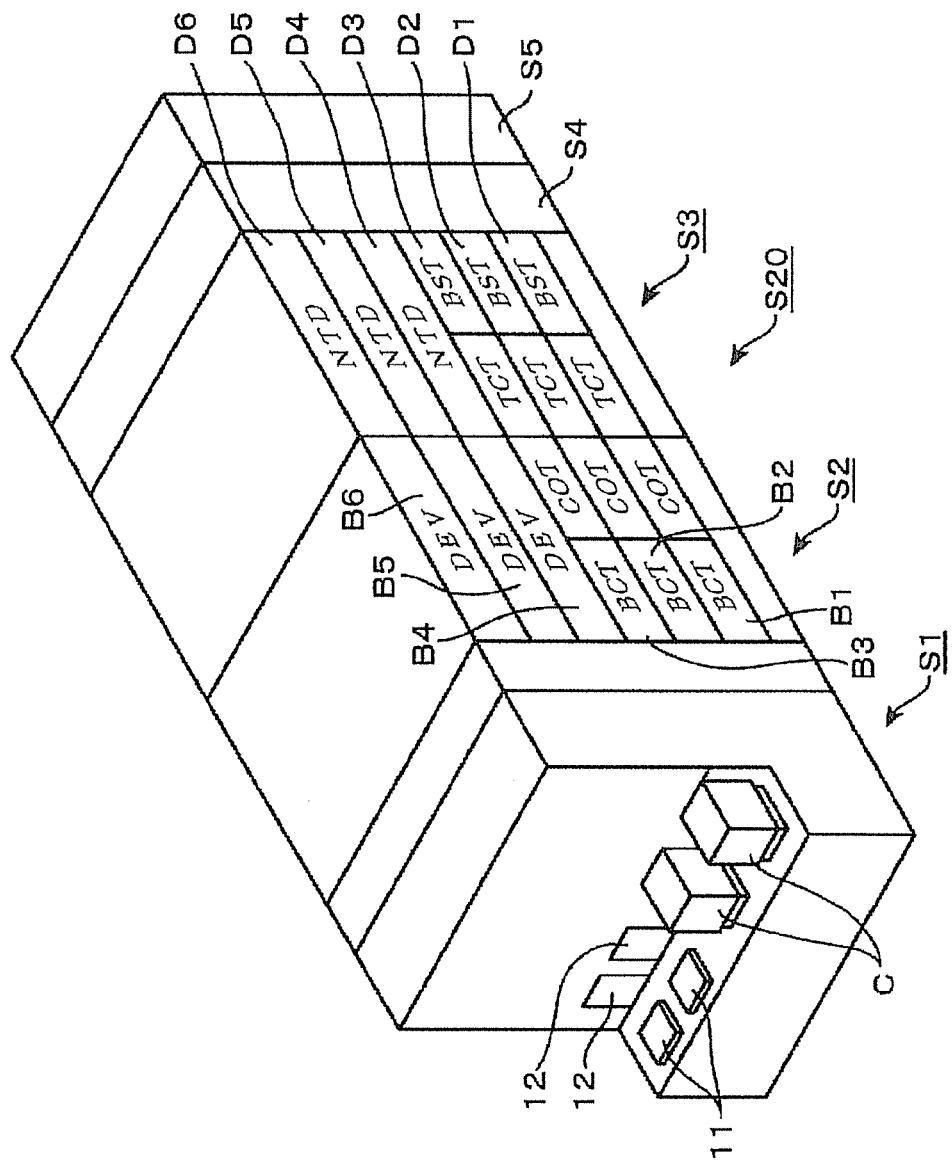
FIG. 2 is a perspective view of the coating and developing apparatus.

The construction of a coating and developing apparatus 1 will now be described with reference to FIGS. 1 to 3. The coating and developing apparatus 1 includes a carrier block Si having carriers C and for carrying each carrier C, in which a plurality of, for example 25, wafers W are hermetically housed, into and out of a processing block S20, the processing block S20 for performing processing of the wafers W, and an interface block S4, the blocks being arranged linearly. To the interface block S4 is connected to an exposure apparatus S5 for performing immersion exposure. For the convenience of description of positional relationships in a plan view of the apparatus, the right side of FIG. 1 is hereinafter referred to as "anterior", the left side as "posterior", the upper side as "left", and the lower side as "right".

The carrier block S1 includes stages 11 for placing the carriers C thereon, shutters 12 provided in a wall in front of the stages 11, and a transfer arm 13 for taking wafers W out of the carriers C via the shutters 12. The transfer arm 13 has five wafer holders 14 arranged in the vertical direction, and is configured to be movable back and forth, vertically movable, rotatable on a vertical axis and movable in the carrier C arrangement direction. The below-described control section 51 assigns ID numbers to wafers W in each carrier C, and the transfer arm 13 transfers the wafers W to a transfer module BU1 of the processing block S20 in a sequential manner such that 5 wafers are transferred at a time and that the wafers W are transferred in order of increasing ID number.

An element having a site on which a wafer W can be placed is herein referred to as "module". A module for carrying out processing of a wafer W, such as heating, processing with a liquid, supply of a gas, peripheral exposure, etc., is herein referred to as "processing module"; and a processing module for supplying a chemical solution or a cleaning liquid is herein referred to as "liquid processing module".

The processing block S20 is composed of an anterior processing block S2 provided on the carrier block S1 side and a posterior processing block S3 provided on the interface block S4 side. The following description is given with reference also to FIG. 4 which is a schematic sectional side view of the anterior processing block S2 and the posterior processing block S3. The anterior processing block S2 is comprised of a stack of first to sixth anterior unit blocks B1 to B6, stacked in this order from the lowest unit block B1, each for performing liquid processing of a wafer W. The anterior unit blocks B1 to B6 each have a liquid processing module for supplying a processing liquid (e.g. a film-forming liquid or a developer) to a substrate to perform liquid processing of the substrate, a heating module for heating the substrate, a main arm A which is a transport means for each unit block, and a transport region R1 in which the main arm A moves. In the illustrated embodiment, the transport region R1 is a transport passage extending linearly from the carrier block Si side to the interface block S4 side. The layout of the modules, the main arm and the transport region are substantially the same among the anterior unit blocks. A wafer W is transported by the main arm A and is subjected to processing in each anterior unit block independently of the other blocks.

The first anterior unit block B1, as a representative of the six anterior unit blocks, will now be described with reference to FIG. 1. The transport region R1, extending from the carrier block S1 side toward the posterior processing block S3, is formed in the center of the first anterior unit block B1. A liquid processing unit 21 is disposed on the right of the transport region R1, and shelf units U1 to U6 are disposed on the left of the transport region R1.

The liquid processing unit 21 is provided therein with an antireflection film-forming module BCT1 and a resist film-forming module COT1, arranged in this order from the side of the carrier block S1 to the side of the posterior processing block S3. The antireflection film-forming module BCT1 includes two spin chucks 22. Each spin chuck 22 is capable of attracting and holding a central portion of the back surface of a wafer W and is rotatable on a vertical axis. A top-open processing cup 23 surrounds the periphery of the spin chuck 22 and prevents scattering of a chemical solution. Upon processing of a wafer W, the wafer W is housed in the processing cup 23, with the central portion of the back surface of the wafer W being held by the spin chuck 22.

The antireflection film-forming module BCT1 has a nozzle 24 which is shared by the two processing cups 23. The nozzle 24 is supported by an arm 25. A drive mechanism 26, via the arm 25, moves the nozzle 24 in the arrangement direction of the processing cups 23 and vertically moves the nozzle 24. Thus, the nozzle 24 can be moved by means of the drive mechanism 26 between the two processing cups 23. The nozzle 24 can therefore eject an antireflection film-forming chemical solution toward the center of a wafer W held by each spin chuck 22. The chemical solution, which has been supplied from the nozzle 24 to the wafer W, spreads to the periphery of the wafer W due to centrifugal force caused by the rotation of the wafer W on a vertical axis, whereby an antireflection film is formed on the wafer W. Though not depicted, the antireflection film-forming module BCT1 is provided with a nozzle for supplying a solvent to a peripheral portion of a wafer W to remove an unnecessary film in the peripheral portion.

The resist film-forming module COT1 has substantially the same mechanical construction as the antireflection film-forming module BCT1 except for having two nozzles. Thus, the resist film-forming module COT1 has two processing cups 23 each for processing of a wafer W and has two spin chucks 22, and the two processing cups 23 and the two spin chucks 22 share one nozzle 27 for supplying a positive resist and one nozzle 28 for supplying a negative resist.

The shelf units U1 to U6 are arranged in this order from the side of the carrier block S1 to the side of the posterior processing block S3. The shelf units U1 to U6 are each comprised of heating modules 27, stacked e.g. in two stages, for performing heating of a wafer W. The anterior unit block B1 thus has 12 heating modules 27. The main arm A1 is provided in the transport region R1. The main arm A1 is configured to be movable back and forth, vertically movable, rotatable on a vertical axis and movable from the side of the carrier block S1 to the side of the posterior processing block S3, so that a wafer W can be transferred between, all the modules of the anterior unit block B1.

Figure 4:
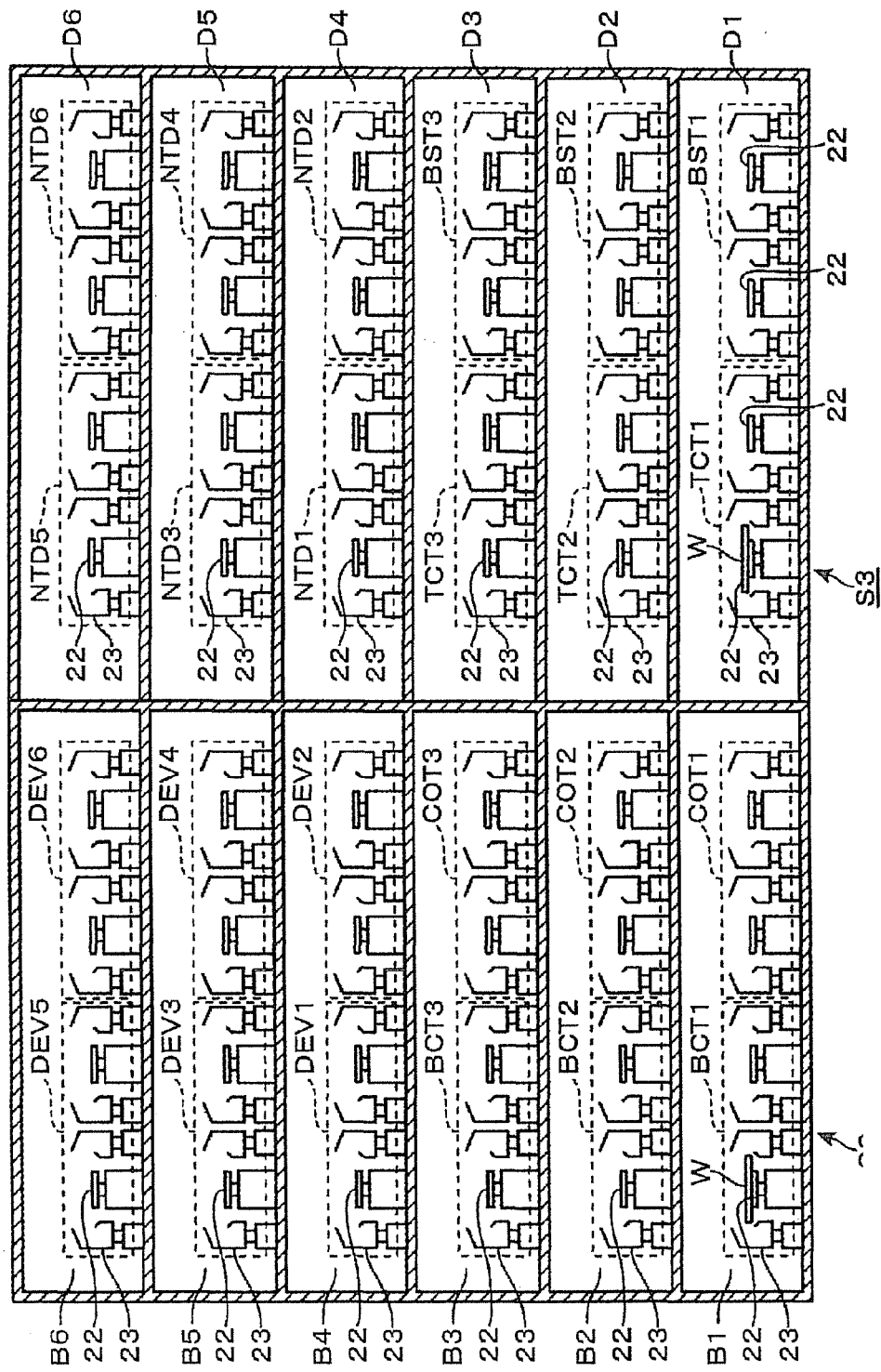
FIG. 4 is a vertical sectional side view of the liquid processing modules of the coating and developing apparatus.

The anterior unit blocks B2 and B3 will now be described. The second anterior unit block B2 and the third anterior unit block B3 each have the same construction as the above-described first anterior unit block B1. As shown in FIG. 4, in the second anterior unit block B2, reference symbol "BCT2" is used for the antireflection film-forming module, and reference symbol "COT2" is used for the resist film-forming module. Further, in the third anterior unit block B3, reference symbol "BCT3" is used for the antireflection film-forming module, and reference symbol "COT3" is used for the resist film-forming module. The anterior unit blocks B1 to B3 constitute early-stage processing unit blocks for performing early-stage processing of a sequence of coating film-forming steps.

The anterior unit blocks B4 to B6, which are unit blocks for developing processing, will now be described. The fourth anterior unit block B4 differs from the first anterior unit block B1 in that instead of the one antireflection film-forming module (BCT1) and the one resist film-forming module (COT1) of the latter, the former is provided with two developing modules DEV1, DEV2. The fifth anterior unit block B5 and the sixth anterior unit block B6 each have the same construction as the fourth anterior unit block B4, and are each provided with two developing modules. Reference symbols "DEV3" and "DEV4" are used for the developing modules provided in the fifth anterior unit block B5. Reference symbols "DEV5" and "DEV6" are used for the developing modules provided in the sixth anterior unit block B6. Each of the developing modules (DEV1 to DEV6) has the same mechanical construction as each of the resist film-forming modules (COT1 to COT3), but supplies, instead of a resist, a developer which develops a positive resist to a wafer W to perform developing processing (positive development).

Figure 3:
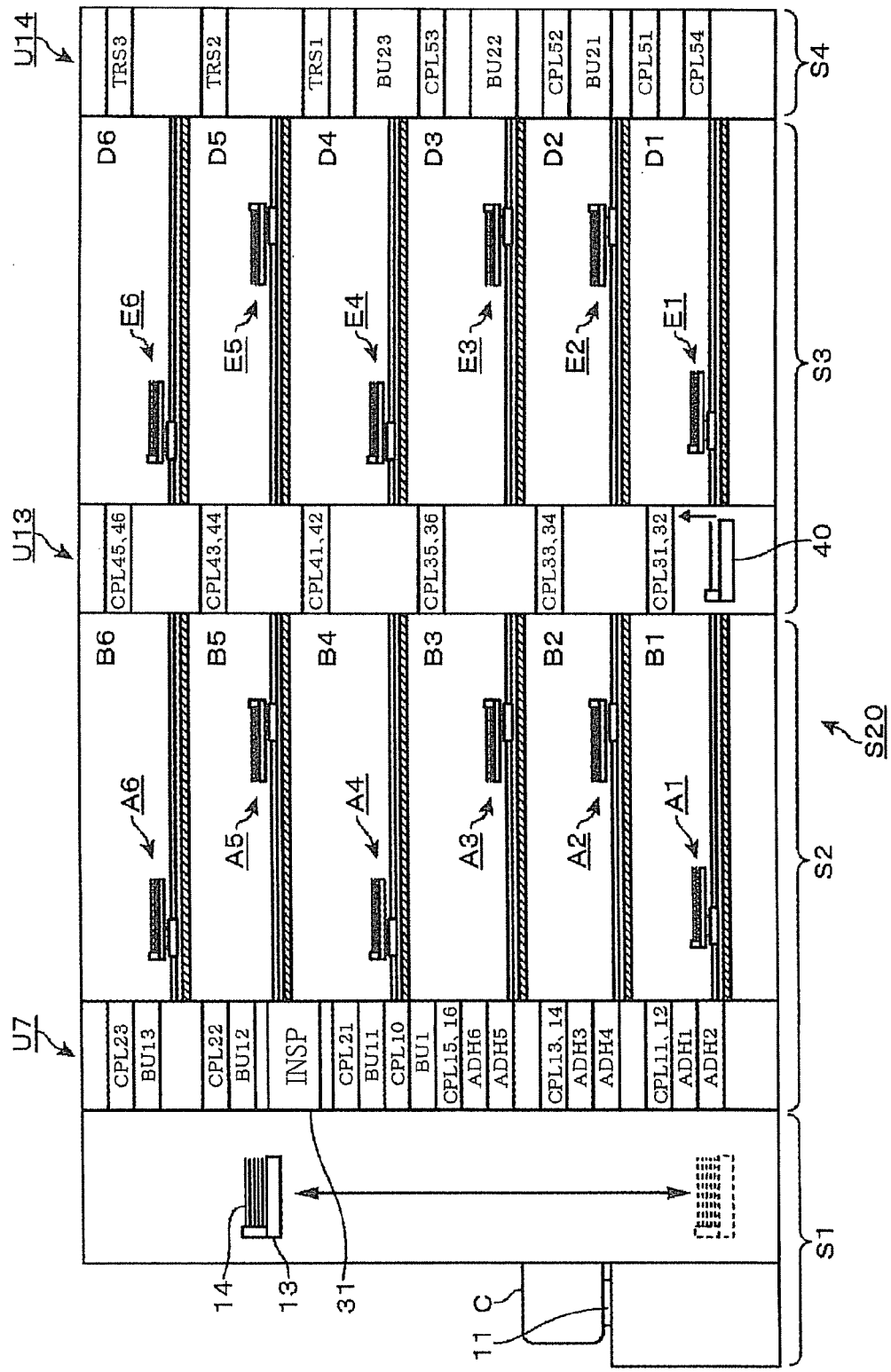
FIG. 3 is a vertical sectional side view of the coating and developing apparatus.

As shown in FIGS. 1 and 3, a shelf unit U7, vertically extending across the anterior unit blocks B1 to B6, is provided in the anterior processing block S2 at a position facing the carrier block S1-side ends of the transport regions R1 of the anterior unit blocks B1 to B6. The shelf unit U7 is comprised of a stack of a plurality of modules. In particular, hydrophobizing modules ADH1, ADH2 and transfer modules CPL11, CPL12 are provided in height positions corresponding to the first anterior unit block B1. Hydrophobizing modules ADH3, ADH4 and transfer modules CPL13, CPL14 are provided in height positions corresponding to the second anterior unit block B2. Hydrophobizing modules ADH5, ADH6 and transfer modules CPL15, CPL16 are provided in height positions corresponding to the third anterior unit block 133.

A transfer module CPL21 and a transfer module BU11 are provided in height positions corresponding to the fourth anterior unit block B4. A transfer module CPL22 and a transfer module BU12 are provided in height positions corresponding to the fifth anterior unit block B5. A transfer module CPL23 and a transfer module BU13 are provided in height positions corresponding to the sixth anterior unit block B6. A transfer module with the reference symbol "CPL" is provided with a cooling stage for cooling a wafer W placed on it. A transfer module with the symbol "BU" is configured to be capable of housing and retaining a plurality of wafers W.

The hydrophobizing modules ADH1 to ADH6 supply a processing gas to the surface, including the bevel portion, of a wafer W to enhance the hydrophobicity of the surface of the wafer W, thereby preventing a film from peeling off the wafer W upon immersion exposure. Especially by enhancing the hydrophobicity of the bevel portion (peripheral end portion) of the wafer W, even when a film(s) is removed from the bevel portion in a liquid processing module(s) and the surface of the bevel portion becomes exposed, the exposed surface has water repellency. This can prevent the remaining film(s) from peeling at the end portion, lying adjacent to the exposed bevel portion, upon immersion exposure.

Further, transfer modules BU1 and CPL10, constituting a transfer section for wafer loading and unloading, are provided in the shelf unit U7 in height positions accessible by the transfer arm 13 of the carrier block S1. The transfer module BU1 has vertically-arranged 5 wafer holders to receive wafers W at a time from the transfer arm 13. Wafers W, which have been transported to the transfer module BU1, are distributed to the anterior unit blocks B1 to B3 in order of increasing ID number assigned by the control section 51. The transfer module CPL0 is employed to return a wafer W to the carrier C.

The shelf unit U7 is provided with an inspection module (INSP) 31. The inspection module 31 inspects a wafer W after development for the presence or absence of an abnormality on various inspection items, such as pattern collapse, abnormal line width, poor resist dissolution, etc. When carrying wafers W out of the anterior unit blocks B4 to B6, those which are scheduled to be carried into the inspection module 31, are transported to the transfer modules BU11 to BU13. On the other hand, those wafers W which are not scheduled to be carried into the inspection module 31 are returned to the carrier C without transporting them to the transfer modules BU11 to BU13. By thus setting a transport route for each wafer, transport of wafers W is controlled such that the wafers W return to the carrier C in order of ID number, i.e. in order of transport from the carrier C.

In the anterior processing block S2, a transfer arm 30 as a first transfer mechanism, configured to be vertically movable and movable back and forth, is provided in the vicinity of the shelf unit U7. The transfer arm 30 transports a wafer W between the modules of the shelf unit U7.

The posterior processing block S3 is comprised of a stack of first to sixth posterior unit blocks D1 to D6, stacked in this order from the lowest unit block D1, each for performing liquid processing of a wafer W. The posterior unit blocks D1 to D6 are located at the same level as the anterior unit blocks B1 to B6, respectively. The posterior unit blocks D1 to D6 each have a liquid processing module, a heating module, a main arm E as a transport means for each unit block, and a transport region R2 in which the main arm E moves. In a plan view, the layout of the modules, the main arm and the transport region is the same among the posterior unit blocks D1 to D6. A wafer W is transported by the main arm E and is subjected to processing in each posterior unit block independently of the other blocks. The first posterior unit block D1, as a representative of the six posterior unit blocks, will now be described with reference to FIG. 1.

The liquid processing unit 32 of the posterior unit block D1 is provided with a protective film-forming module TCT1 and a back surface cleaning module BST1, arranged in this order toward the interface block S4. The protective film-forming module TCT1 has the same mechanical construction as the antireflection film-forming module BCT1 except that a chemical solution for the formation of a water-repellent protective film is supplied to a wafer W. Thus, the protective film-forming module TCT1 has two processing cups 23 each for processing a wafer W and has two spin chucks 22, and the two processing cups 23 and the two spin chucks 22 share one nozzle 24.

The back surface cleaning module BST has a similar construction to the antireflection film-forming module BCT except that it is not provided with a nozzle 24, but instead is provided, for each processing cup 23, with a not-shown nozzle for supplying a cleaning liquid to the back surface and the bevel portion of a wafer W to clean the back surface of the wafer W. The back surface cleaning module BST may be configured to supply a cleaning solution to one of the back surface and the bevel portion of a wafer W. Shelf units U8 to U12 are provided opposite the liquid processing unit 32 and are each comprised of two heating modules 33.

The second posterior unit block D2 and the third posterior unit block D3 each have the same construction as the above-described first posterior unit block D1. In the second posterior unit block D2, reference symbol "TCT2" is used for the protective film-forming module, and reference symbol "BST2" is used for the back surface cleaning module. In the third posterior unit block D3, reference symbol "TCT3" is used for the protective film-forming module, and reference symbol "BST3" is used for the back surface cleaning module. The posterior unit blocks D1 to D3 constitute later-stage processing unit blocks for performing later-stage processing of a sequence of coating film-forming steps.

The fourth posterior unit block D4 differs from the first posterior unit block D1 in that instead of the protective film-forming module TCT1 and the back surface cleaning module BST1 of the latter, the former is provided with negative-tone developing modules NTD1, NTD2. The negative-tone developing modules NTD1, NTD2 supply a developer which develops a negative resist to a wafer W to perform developing processing (negative development). The negative-tone developing module NTD1 has the same mechanical construction as the developing module DEV1, but supplies a different type of developer. The fifth posterior unit block D5 and the sixth posterior unit block D6 each have the same construction as the fourth posterior unit block D4. The fifth posterior unit block D5 has negative-tone developing modules NTD3, NTD4, and the sixth posterior unit block D6 has negative-tone developing modules NTD5, NTD6.

A developer for use in the negative-tone developing modules (NTD1 to NTD6), a chemical solution for use in the antireflection film-forming modules (BCT1 to BCT3) and a resist for use in the resist film-forming modules (COT1 to COT3) each contain an organic solvent. The processing cups 23 of the negative-tone developing modules and the processing cups 23 of the antireflection film-forming modules and the resist film-forming modules are each connected to a drainage path for discharging a used chemical solution or developer, and the drainage paths join together on the downstream side. The drainage paths, connected to the negative-tone developing modules, the antireflection film-forming modules and the resist film-forming modules, are provided independent of drainage paths connected to the other liquid processing modules so that the organic solvents can be discharged separately from waste liquids from the other liquid processing modules.

As shown in FIGS. 1 and 3, a shelf unit U13, vertically extending across the posterior unit blocks D1 to D6, is provided in the posterior processing block S3 at a position facing the anterior processing block S2-side ends of the transport regions R2 of the posterior unit blocks D1 to D6. The construction of the shelf unit U13 will now be described. The shelf unit U13 is comprised of a stack of a plurality of modules. Transfer modules CPL31, CPL32 are provided in a height position corresponding to the first posterior unit block D1. Transfer modules CPL33, CPL34 are provided in a height position corresponding to the second posterior unit block D2, and transfer modules CPL35, CPL36 are provided in a height position corresponding to the third posterior unit block D3. Further, transfer modules CPL41, CPL42 are provided in a height position corresponding to the fourth posterior unit block D4, transfer module CPL43, CPL44 are provided in a height position corresponding to the fifth posterior unit block D5, and transfer modules CPL45, CPL46 are provided in a height position corresponding to the sixth posterior unit block D6.

Each module of the shelf unit U13 is accessible by the main arm (one of E1 to E6) of a posterior unit block (one of D1 to D6) located at the same level as the module and by the main arm (one of A1 to A6) of an anterior unit block (one of B1 to B6) located at the same level as the module. In the posterior processing block S3, a transfer arm 40, constituting an auxiliary transfer mechanism, is provided in the vicinity of the shelf unit U13. The transfer arm 40 is configured to be vertically movable and movable back and forth with respect to the shelf unit U13. The transfer arm 40 transports a wafer W between the modules, lying in height positions corresponding to the unit blocks B1 to B6, of the shelf unit U13.

Figure 5:
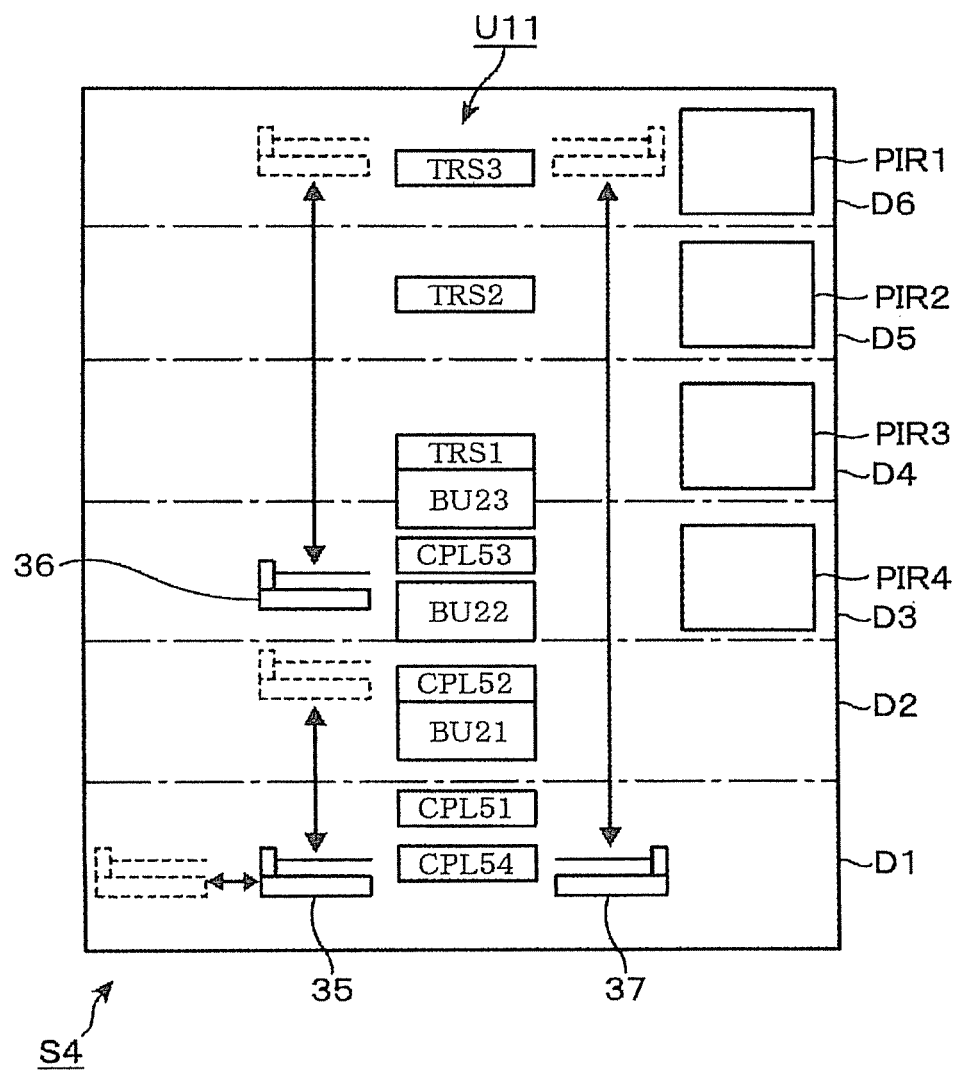
FIG. 5 is a vertical sectional front view of an interface block.

The construction of the interface block S4 will now be described with reference also to FIG. 5. The interface block S4 is provided with a shelf unit U11 in a position accessible by the main arms El to E6 of the posterior unit blocks D1 to D6. The shelf unit U11 has transfer modules TRS1, TRS2 and TRS3 in height positions corresponding to the unit blocks D4, D5 and D6, respectively, and has transfer modules CPL51, CPL52 and CPL53 in height positions corresponding to the unit blocks D1, D2 and D3, respectively. The shelf unit U11 also has transfer modules BU21 to BU23 and CPL54. These modules are stacked on top of each other.

The interface block S4 is provided with a stack of a plurality of, for example four, post-exposure cleaning modules PIR1 to PIR4. Each post-exposure cleaning module PIR has the same mechanical construction as each resist film-forming module COT, but supplies, instead of a resist, a chemical solution for removal of a protective film and for cleaning to the surface of a wafer W.

The interface block S4 is also provided with two interface arms 35, 36. The interface arms 35, 36 are configured to be vertically movable and movable back and forth. The interface arm 35 is also movable in a horizontal direction. The interface arm 35 approaches the exposure apparatus S5 and the transfer modules BU21, CPL54 to transfer a wafer W between them. The interface arm 36 approaches the transfer modules of the shelf unit U11 and the post-exposure cleaning modules PIR1 to PIR4 to transfer a wafer W between these modules. Note that, in this specification, the numerical part (e.g., "1") of a reference sign comprising an alphanumeric mix (e.g., "COT1") designating a processing module, is sometimes omitted (e.g., "COT1"→ "COT") in a case where individual processing modules need not be distinguished from each other.

Figure 6:
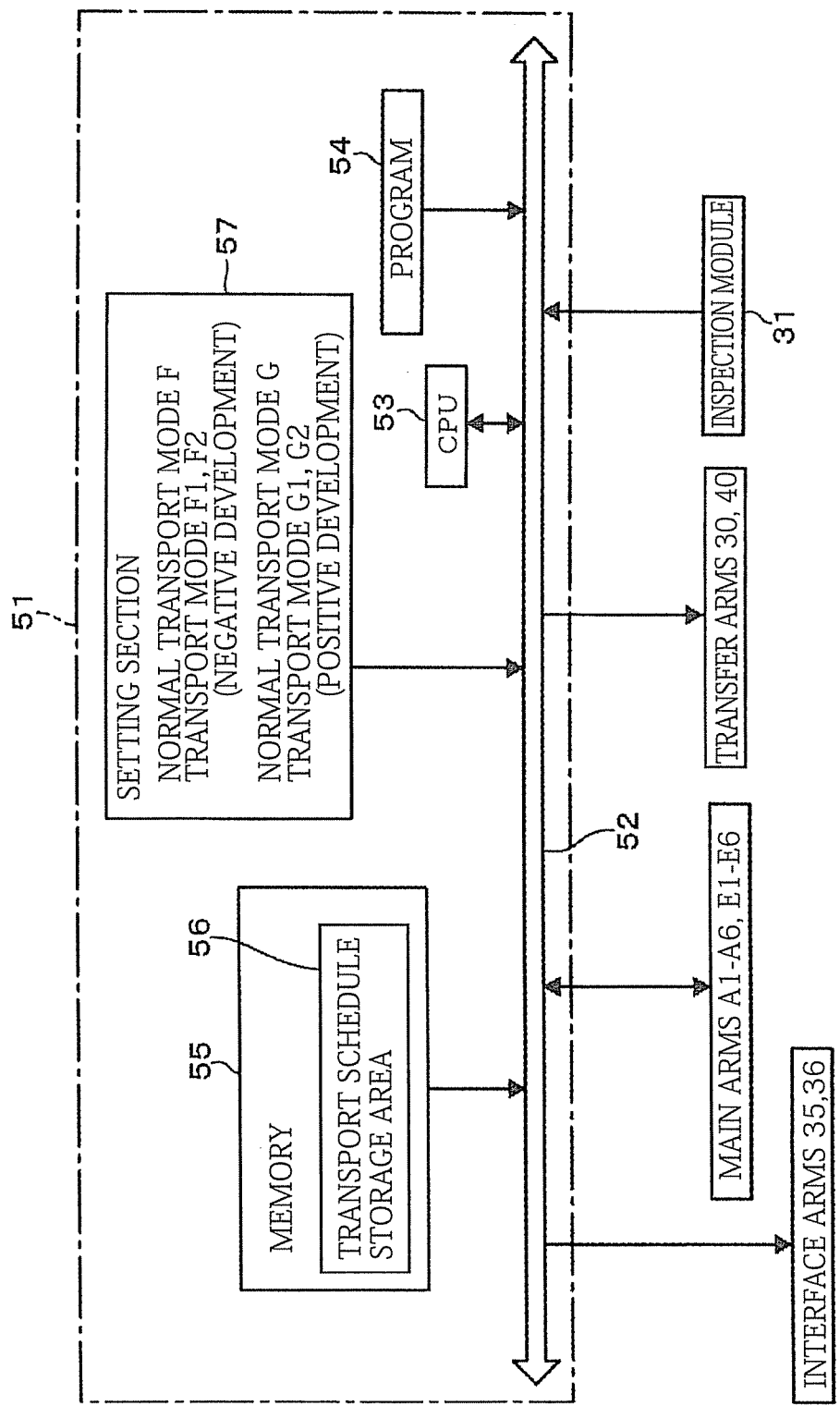
FIG. 6 is a diagram showing the construction of the control section of the coating and developing apparatus.
Figure 7:
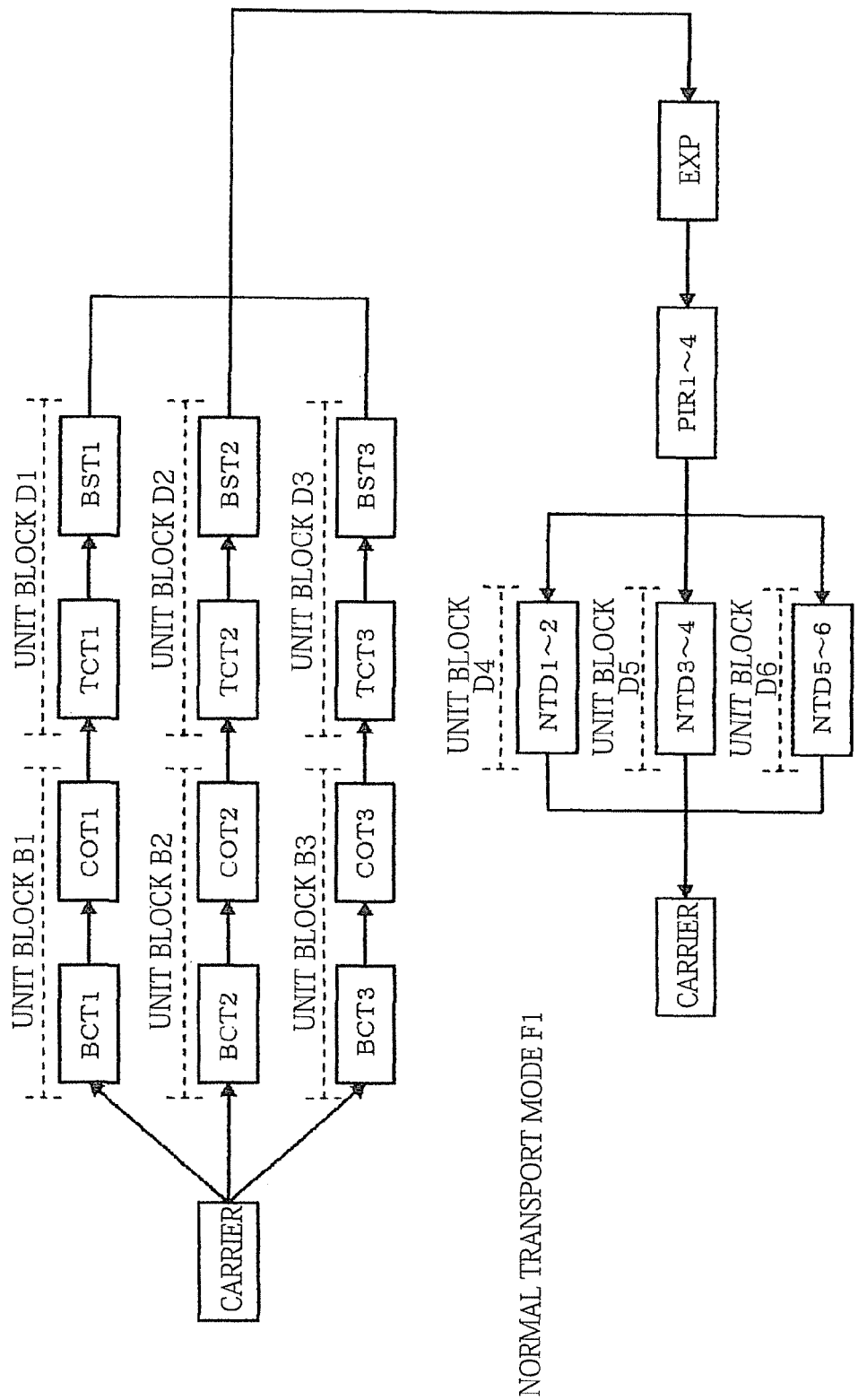
FIG. 7 is a flow diagram illustrating a wafer transport route in the coating and developing apparatus.

The control section 51 provided in the coating and developing apparatus 1 will now be described with reference to FIG. 6. In FIG. 6, "52" indicates a bus, "53" indicates a CPU, and "54" indicates a program. The program 54 contains instructions (steps) to output control signals to various components of the coating and developing apparatus 1, to transport wafers W between modules in the below-described manners, and to carry out processing of each wafer W, such as supply of a chemical solution or a cleaning liquid, heating, etc. The program 54 is stored in a storage medium such as flexible disk, compact disk, hard disk, MO (magneto-optical) disk, memory card, etc., and installed in the control section 51.

A memory 55 is connected to a bus 52. The memory 55 contains an area in which values of process parameters, such as processing temperature, processing time, the amount of a chemical solution supplied, electric power, etc. are written. When the CPU 53 executes the instructions of the program 54, the process parameters are retrieved, and control signals according to the parameter values are sent to the components of the modules of the coating and developing apparatus 1.

The memory 55 contains a transport schedule storage area 56. The ID of a wafer W, the modules to which the wafer W is to be transported and the order of transport to the modules are, in their relation, stored as a transport schedule in the transport schedule storage area 56. The transport schedule also specifies which one of the two processing cups 23 of a liquid processing module a wafer W is to be carried into. Though the transport schedule is set prior to processing of wafers W, it is changed upon a determination to stop wafer transport to a unit block(s) or a module(s), and wafers W are then transported according to the changed transport schedule as will be described later.

A setting section 57 is connected to the bus 52. The setting section 57 is, for example, comprised of a keyboard and a mouse, a tough panel, or the like, so that the user can select a transport mode for wafers W. Normal transport modes, to be implemented when all the unit blocks are operable, include a first normal transport mode Fl in which coating of a negative resist is performed in the resist film-forming modules COT and developing processing is performed in the posterior unit blocks D4 to D6, and a second normal transport mode G1 in which coating of a positive resist is performed in the resist film-forming modules COT and developing processing is performed in the anterior unit blocks B4 to B6. The user can select one of the two normal transport modes via the setting section 57.

During the implementation of the normal transport mode F1 or G1, the user can switch the transport mode to the below-described mode F2, F3, G2 or G3 in order to perform maintenance of a unit block. The switching between transport modes is performed automatically in some cases, as will be described later. Upon switching to a transport mode, the transport schedule is changed according to the switched transport mode, and control signals are sent to the main arms A, E, the transfer arms 13, 30, 40 and the interface arms 35, 36 so that wafers W will be transported along a switched transport route. The user can also specify a wafer W to be inspected in the inspection module 31 by specifying the wafer ID via the setting section 57.

The main arms A and the main arms E each output a positional signal, indicating the position of the main arm, to the control section 51 and, based on the positional signal, the control section 51 determines the presence or absence of an abnormality in the operation of the main arm. The processing modules each output a signal, indicating the operation of the module, to the control section 51 and, based on the signal, the control section 51 determines the presence or absence of an abnormality in the operation of the processing module. The control section 51 changes the transport mode when it determines the presence of an operational abnormality in one of the main arms A, E and the processing modules of the unit blocks.

<Normal Transport Mode F1>

Figure 10:
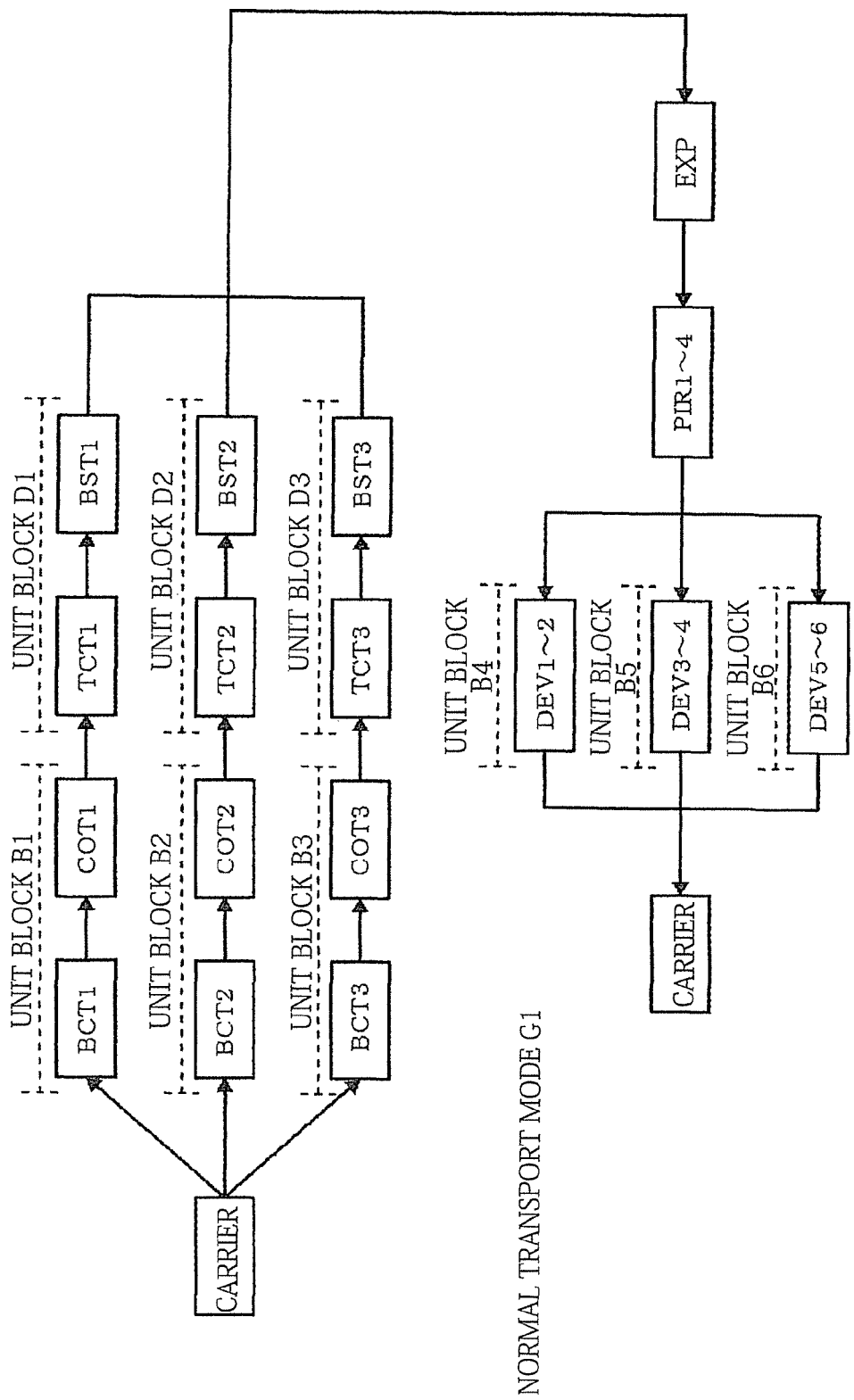
FIG. 10 is a flow diagram illustrating a wafer transport route in the coating and developing apparatus.

A transport route for wafers W in the coating and developing apparatus 1 during the implementation of a normal transport mode F1 will now be described. FIG. 10 schematically shows the transport route. Wafers W, which have been transported from a carrier C to the buffer module BU1, are distributed to the first to third anterior unit blocks B1 to B3. After processing in one of the three unit blocks, the wafers W are each transported along one of the following routes: the first anterior unit block B1→ the first posterior unit block D1; the second anterior unit block B2→ the second posterior unit block D2; the third anterior unit block B3→ the third posterior unit block D3. After processing in the first to third posterior unit blocks D1 to D3, the wafers W are each carried into the exposure apparatus S5. The wafers W after exposure are distributed to the fourth to sixth posterior unit blocks D4 to D6, where the wafers W undergo developing processing.

In this transport mode, wafers W distributed to the posterior unit blocks D1, D2 and D3 are distributed to the posterior unit blocks D4, D5 and D6, respectively, and, after passing through the anterior unit blocks B4, B5 and B6, respectively, are returned to the carrier C. Further, in this transport mode, wafers W are distributed to the unit blocks B1 to B3 in order of increasing wafer number assigned by the control section 51 and in a cyclic manner, e.g. in the order of unit block B1, B2, B3, B1, B2, B3, B1 . . . .

The wafer transport route will now be described in greater detail. A wafer W which is set to be distributed from the transfer module BU1 to the first anterior unit block B1, is transported in the order of: the transfer arm 30→ the hydrophobizing module ADH1 or ADH2. The wafer W after hydrophobizing processing is then transported by the main arm A1 in the following order: the transfer module CPL11→ the antireflection film-forming module BCT1→ the heating module 27→ the transfer module CPL12→ the resist film-forming module COT1→ the heating module 27→ the transfer module CPL31. An antireflection film and a negative resist film are thus sequentially formed on the wafer W.

The wafer W is carried by the main arm E1 into the first posterior unit block D1, and transported in the order of: the protective film-forming module TCT1→ the heating module 33 → the transfer module CPL32. A protective film is thus formed on the wafer W. Subsequently, the wafer W is transported to the back surface cleaning module BST1, where the back surface of the wafer is cleaned. Thereafter, the wafer W is transported in the order of: the main arm E1→ the transfer module CPL51. Thus, the wafer W is carried into the interface block S4. Thereafter, the substrate W is transported in the following order: the interface arm 36→ the transfer module BU22 or BU23→ the interface arm 36→ the transfer module CPL54→ the interface arm 35→ the exposure apparatus (EXP) S5. The wafer W is thus subjected to immersion exposure.

Figure 8:
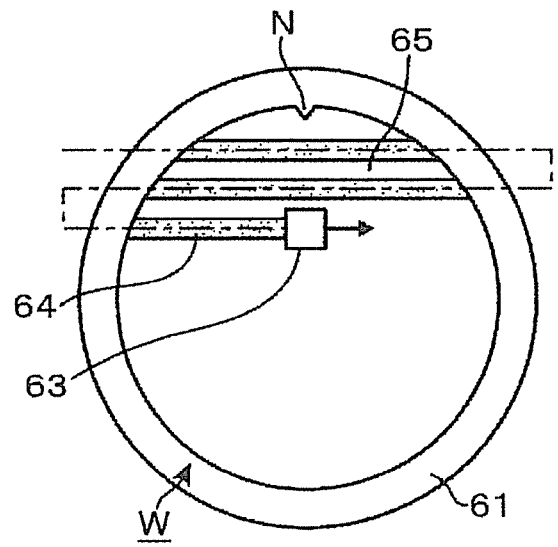
FIG. 8 is a diagram illustrating exposure of a wafer W.
Figure 9:
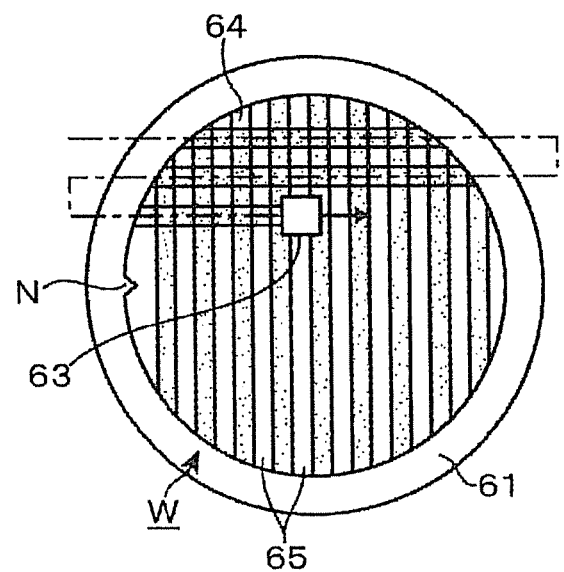
FIG. 9 is a diagram illustrating exposure of a wafer W.

FIGS. 8 and 9 illustrate processing of a wafer in the exposure apparatus S5. In the Figures, "61" is a stage on which a wafer W to be exposed is placed. The stage 61 rotates on a vertical axis. "N" is a notch formed in the wafer W. "63" is an exposure head which moves while exposing the wafer W. The exposure head 63 moves on parallel lines across the wafer W, as shown by the arrow and the dashed line, while applying light to the wafer W. A striped-pattern exposed area 64 is thus formed in the wafer W. In the Figures, the exposed area 64 is shown by the dotted area. Thereafter, the wafer W rotates by 90 degrees, and the exposure head 63 again moves in the same manner over the wafer W, thereby exposing the wafer W in a lattice pattern. In the Figures, "65" indicates a non-exposed area.

The wafer W after immersion exposure is transported in the following order: the interface arm 35→ the transfer module BU21→ the interface arm 36→ one of the post-exposure cleaning modules PIR1 to PIR4→ the interface arm 36→ the transfer module TRS1. Thereafter, the wafer W is transported by the main arm E4 in the fourth posterior unit block D4 in the order of the heating module 33→ the transfer module CPL41→ the negative-tone developing module NTD1 or NTD2, where the non-exposed area 65 is dissolved in a developer to form a lattice-like pattern of holes. The holes can be used, for example, for the formation of contact holes. After the development, the wafer W is transported in the order of the main arm E4 the heating module 33→ the transfer module CPL42.

Thereafter, the wafer W is transported by the main arm A4 in the following order: the transfer module CPL21→ the transfer arm 30→ the transfer module BU11→ the transfer arm 30→ the inspection module 31. The wafer W after inspection is transported in the order of: the transfer arm 30→ the transfer module CPL10→ the transfer arm 13, and is returned by the transfer arm 13 to the carrier C. A wafer W which is not an inspection object, after development and heating, is transported in the following order: the transfer module CPL21→ the transfer arm 30→ the transfer module CPL10→ the transfer arm 13→ the carrier C.

A wafer W which is distributed to the second anterior unit block B2, is transported in a similar manner to a wafer W distributed to the first anterior unit block B1. The transport route for a wafer W distributed to the second anterior unit block B2 will be briefly described. The wafer W is transported in the order of the transfer module BU1→ the transfer arm 30→ the hydrophobizing module ADH3 or ADH4. The wafer W is then transported by the main arm A2 in the following order: the transfer module CPL13→ the antireflection film-forming module BCT2→ the heating module 27→ the transfer module CPL14→ the resist film-forming module COT2→ the heating module 27→ the transfer module CPL33. A negative resist film is thus formed on the wafer W.

Thereafter, the wafer W is transported by the main arm E2 in the following order: the protective film-forming module TCT2→ the heating module 33→ the transfer module CPL34→ the back surface cleaning module BST2→ the transfer module CPL52. The wafer W is then transferred to the interface arm 36. Thereafter, the wafer W is transported to the exposure apparatus (EXP) S5 and then to one of the post-exposure cleaning modules PIR along the same route as a wafer W distributed to the first anterior unit block B1. Thereafter, the wafer W is transported in the following order: one of the post-exposure cleaning modules PIR→ the interface arm 36→ the transfer module TRS2→ the main arm E5→ the heating module 33→ the transfer module CPL43→ the negative-tone developing module NTD3 or NTD4. The wafer W is thus subjected to developing processing.

Thereafter, the wafer W is transported in the following order: the main arm E5→ the heating module 33→ the transfer module CPL44→ the main arm A5→ the transfer module CPL22→ the transfer arm 30→ the transfer module BU12→ the transfer arm 30→ the inspection module 31→ the transfer arm 30→ the transfer module CPL10→ the transfer arm 13→ the carrier C. A wafer W which is not an inspection object, after development and heating, is returned from the transfer module CPL22 to the carrier C along the above-described route.

A wafer W which is distributed to the third anterior unit block B3, is also transported and processed in a similar manner to a wafer W distributed to the first anterior unit block B1. The transport route will be briefly described. The wafer W is transported in the order of: the transfer module BU1→ the transfer arm 30→ the hydrophobizing module ADH5 or ADH6. The wafer W is then transported by the main arm A3 in the following order: the transfer module CPL15→ the antireflection film-forming module BCT3→ the heating module 27→ the transfer module CPL16→ the resist film-forming module COT3→ the heating module 27→ the transfer module CPL35. A negative resist film is thus formed on the wafer W.

Thereafter, the wafer W is transported in the following order: the main arm E3→ the protective film-forming module TCT3→ the main arm E3→ the heating module 33→ the main arm E3→ the transfer module CPL36→ the back surface cleaning module BST3→ the transfer module CPL53→ the interface arm 36. Thereafter, the wafer W is transported in the interface block S4 along the above-described route and thus undergoes exposure and post-exposure cleaning, and is then transferred in the order of: the interface arm 36→ the transfer module TRS3. Thereafter, the wafer W is transported by the main arm E6 in the order of the heating module 33→ the transfer module CPL45→ the negative-tone developing module NTD5 or NTD6, where the wafer W is subjected to developing processing.

Thereafter, the wafer W is transported in the following order: the main arm E6→ the heating module 33→ the transfer module CPL46→ the main arm A6→ the transfer module CPL23→ the transfer arm 30→ the transfer module BU13→ the transfer arm 30→ the inspection module 31 the transfer arm 30→ the transfer module CPL10→ the transfer arm 13→ the carrier C. A wafer W which is not an inspection object, after development and heating, is returned from the transfer module CPL23 to the carrier C along the above-described route.

<Normal Transport Mode G1>

A wafer transport route in a normal transport mode G1 will now be described with reference to FIG. 10, focusing on differences from the normal transport mode F1. Wafers W are transported to the anterior unit blocks B1 to B3, the posterior unit blocks D1 to D3, the interface block S4 and the exposure apparatus S5 as in the normal transport mode F1. However, a positive resist is supplied to a wafer W in each resist film-forming module COT. Wafers W which have undergone exposure and have been distributed to the anterior unit blocks B1, B2, B3 are carried into the transfer modules TRS1, TRS2, TRS3 of the interface block S4, respectively.

The wafers W which have been carried into the transfer module TRS1 are each transferred in the following order and carried into the anterior unit block B4: the main arm E4→ the transfer module CPL41→ the main arm A4. The main arm A4 then transfers the wafer W in the following order: the heating module 27→ the transfer module CPL42→ the developing module DEV1 or DEV2→ the heating module 27→ the transfer module CPL21.

The wafers W which have been carried into the transfer module TRS2 are each transferred in the following order and carried into the anterior unit block B5: the main arm E5→ the transfer module CPL43→ the main arm A5. The main arm A5 then transfers the wafer W in the following order: the heating module 27 the transfer module CPL44→ the developing module DEV3 or DEV4→ the heating module 27→ the transfer module CPL22.

The wafers W which have been carried into the transfer module TRS3 are each transferred in the following order and carried into the anterior unit block B6: the main arm E6→ the transfer module CPL45→ the main arm A6. The main arm A6 then transfers the wafer W in the following order: the heating module 27→ the transfer module CPL46→ the developing module DEV5 or DEV6→ the heating module 27→ the transfer module CPL23. The wafers W which have thus been transported to the transfer modules CPL21 to CPL23 are transported to the carrier C in the same manner as in the normal transport mode F1. In the exposure processing in the normal transport mode G1, the above-described rotation of the stage 61 and the second movement and exposure of the exposure head 63 after once exposing the entire area of a wafer W as shown in FIG. 9 are not performed, and a resist pattern different from that in the normal transport mode F1 is formed.

<Transport Mode F2>

Figure 11:
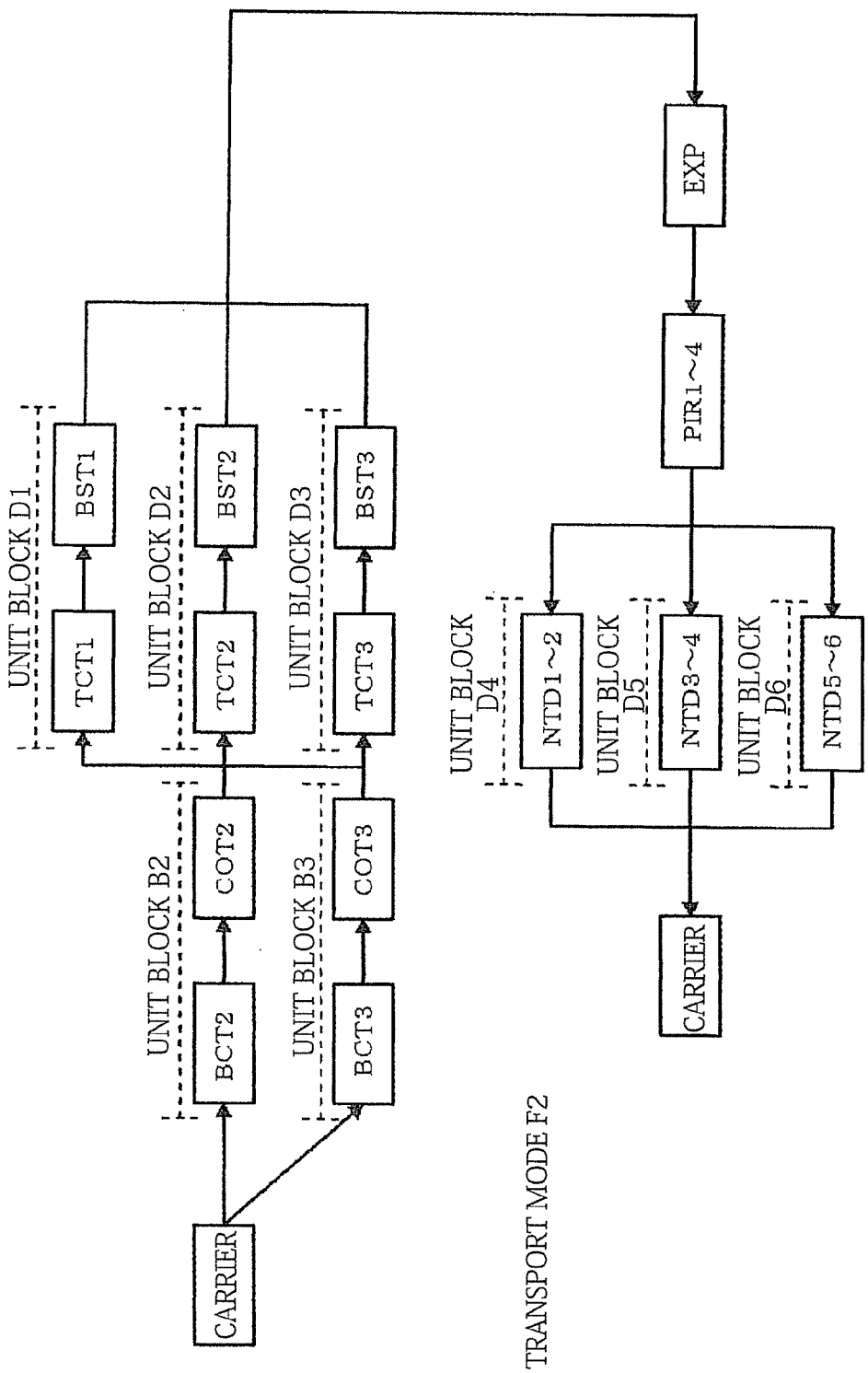
FIG. 11 is a flow diagram illustrating a wafer transport route in the coating and developing apparatus.

Transport of wafers W during the implementation of a transport mode F2 will now be described. The transport mode F2 is a mode which is to be implemented when one of the anterior unit blocks B1 to B3 becomes unable to perform processing during the implementation of the normal transport mode F1. In the transport mode F2, after wafers W are processed in usable anterior unit blocks of the blocks B1 to B3, the wafers W are distributively transported to the posterior unit blocks D1 to D3. The following description, made with reference to FIG. 11, illustrates the case where the control section 51 detects an abnormality in the main arm A1. Upon detection of the abnormality, the control section 51 stops the operation of the main arm A1 and the operation of each processing module of the anterior unit block B1. The transfer arm 30 then transport subsequent wafers W alternately to the second and third anterior unit blocks B2, B3. Each wafer W is transported and processed in the anterior unit block B2 or B3 along the above-described transport route, and is then transported to the transfer module CPL33 or CPL35 of the shelf unit U13.

Of the wafers W which have been transported to the transfer modules CPL33 and CPL35, those wafers W which were scheduled to be processed in the first anterior unit block B1 in the normal transport mode F1, are each transported by the transfer arm 40 to the transfer module CPL31 and carried by the main arm E1 into the posterior unit block D1. The other wafers W are each carried by the main arm E2 or E3 from the transfer module CPL33 or CPL35 into the posterior unit block D2 or D3. Thereafter, the wafers W are each transported and processed in the same manner as in the normal transport mode F1. The user can perform repair of a failure or maintenance, such as periodic inspection, check of adjustment, etc. on the first anterior unit block B1 to which transport of wafers W has been stopped.

When the anterior unit block B2 or B3 becomes unable to perform processing, wafers W are processed in usable anterior unit blocks B as in the above-described case. Thereafter, the wafers W are distributed by the transfer arm 40 to those transfer modules CPL which are for carrying the wafers W into the posterior unit blocks D1 to D3.

<Transport Mode F3>

Transport of wafers W during the implementation of a transport mode F3 will now be described. The transport mode F3 is a mode which is to be implemented when one of the posterior unit blocks D1 to D3 becomes unable to perform processing during the implementation of the normal transport mode F1. In the transport mode F3, wafers W which have undergone processing in the anterior unit blocks B1 to B3 are distributed to usable ones of the posterior unit blocks D1 to D3.

Figure 12:
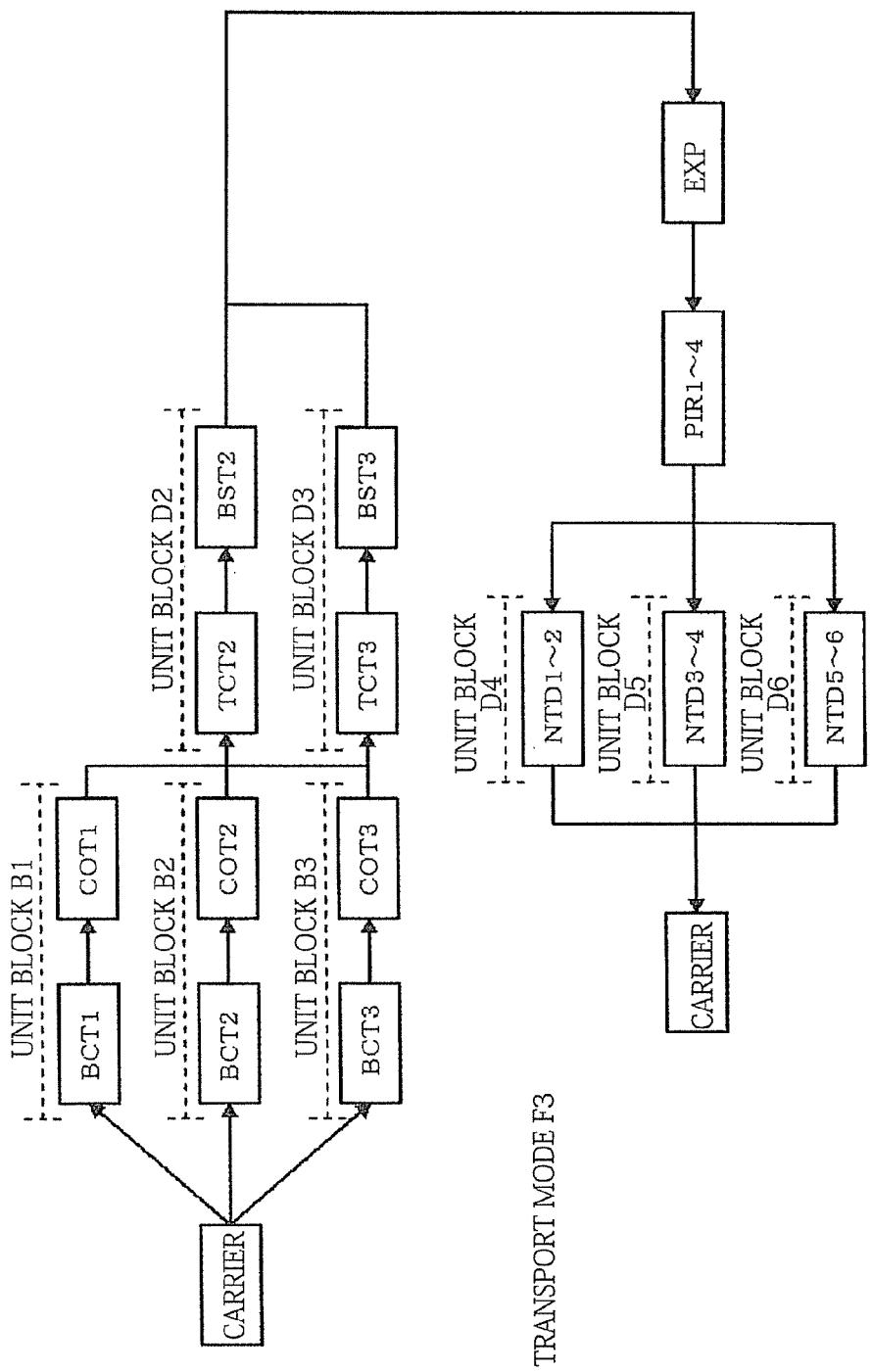
FIG. 12 is a flow diagram illustrating a wafer transport route in the coating and developing apparatus.

The following description, made with reference to FIG. 12, illustrates the case where an abnormality is detected in the main arm E1. Upon detection of the abnormality, the control section 51 stops the operation of the main arm E1 and the operation of each processing module of the posterior unit block D1. Subsequent wafers W, which have been processed in the anterior unit block B1 and transported to the transfer module CPL31, are distributively transported by the transfer arm 40 alternately to the transfer modules CPL33, CPL35 of the shelf unit U13. The wafers W are then carried from the transfer modules CPL33, CPL35 into the posterior unit blocks D2, D3, respectively, where the wafers W undergo processing.

After exposure, the wafers W are distributed by the interface arm 36 to the posterior unit blocks D4 to D6 and, after processing in these unit blocks, the wafers W are returned to the carrier C in the same manner as in the normal transport mode F1. The user can perform repair or maintenance on the first posterior unit block D1 to which transport of wafers W has been stopped. When the posterior unit block D2 or D3 becomes unable to perform processing, as in the above-described case, wafers W are distributed by the transfer arm 40 to usable ones of the posterior unit blocks D1 to D3 and, after processing in the usable unit blocks D, the wafers W are distributed to the posterior unit blocks D4 to D6.

<Transport Mode G2>

Figure 13:
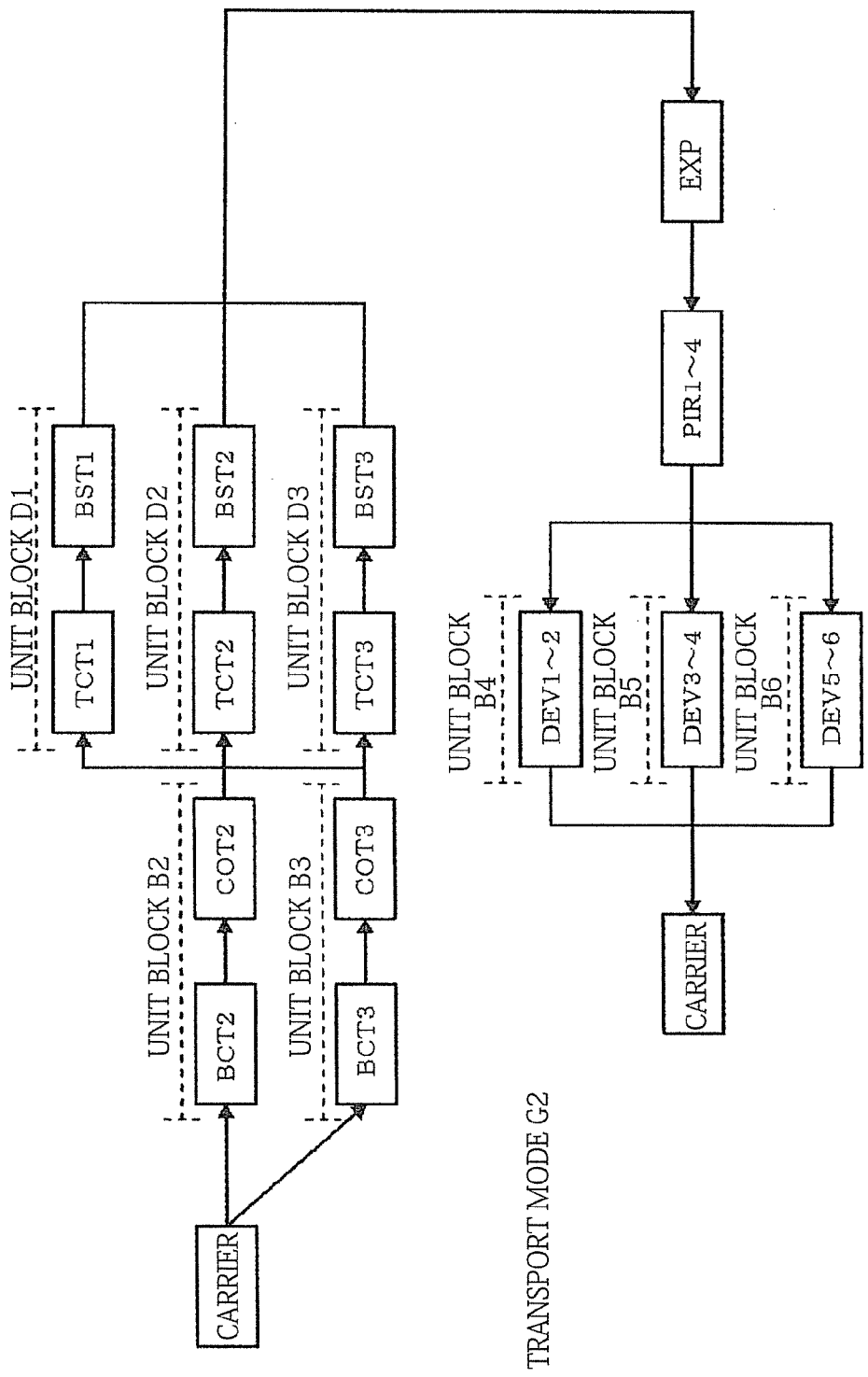
FIG. 13 is a flow diagram illustrating a wafer transport route in the coating and developing apparatus.

A transport mode G2 will now be described. The transport mode G2 is a mode which is to be implemented when one of the anterior unit blocks B1 to B3 becomes unable to perform processing during the implementation of the normal transport mode G1. In the transport mode G2, wafers W are processed in usable ones of the anterior unit blocks B1 to B3, and are then distributed to the posterior unit blocks D1 to D3. FIG. 13 shows a wafer transport route to be employed when the anterior unit block B1 becomes unable to perform processing as in the case of FIG. 11. Wafers W are transported in the same manner as in the transport mode F2 except that the wafers are developed in the anterior unit blocks B4 to B6 instead of the posterior unit blocks D4 to D6.

<Transport Mode G3>

Figure 14:
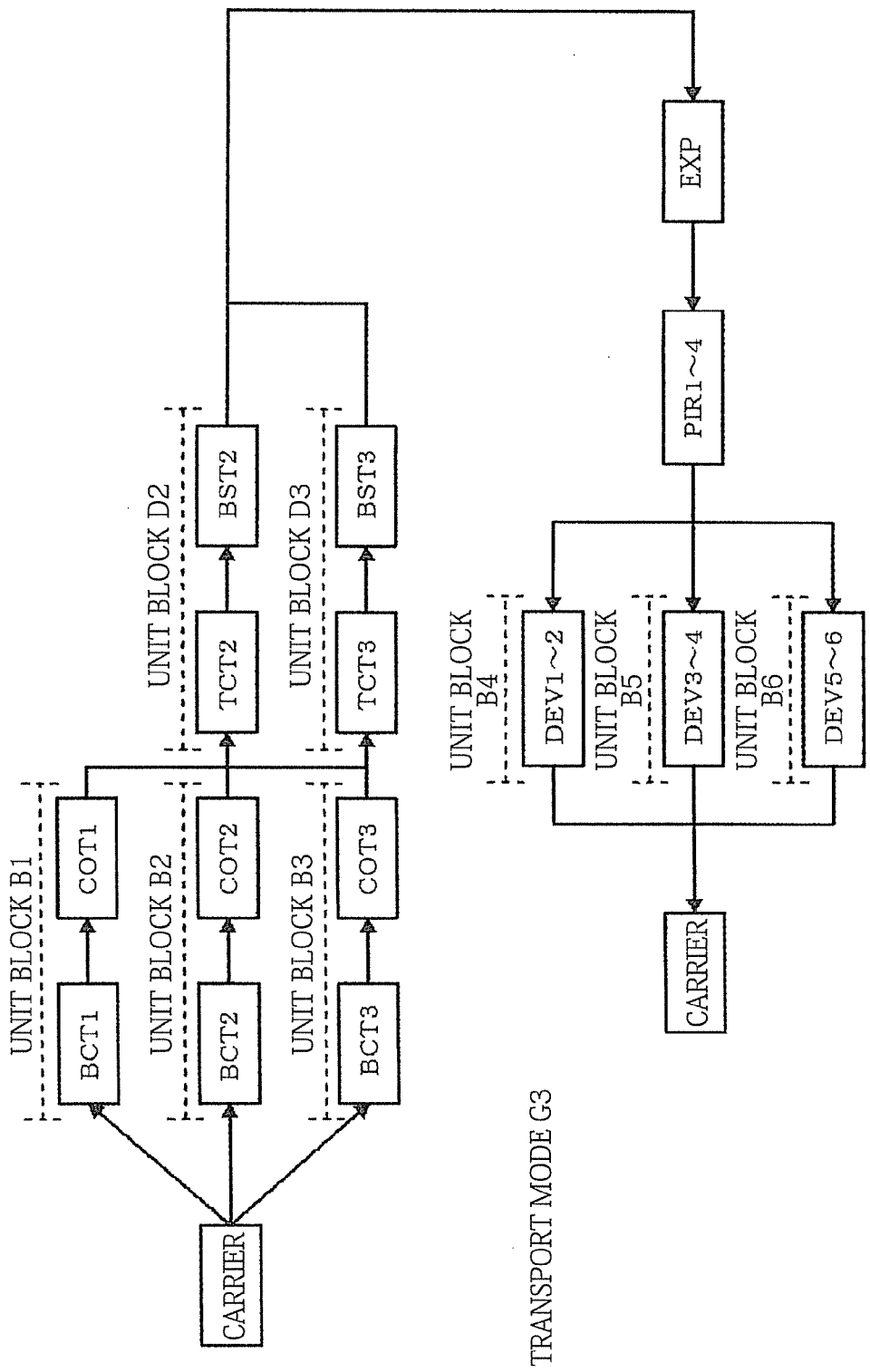
FIG. 14 is a flow diagram illustrating a wafer transport route in the coating and developing apparatus.

A transport mode G3 will now be described. The transport mode G3 is a mode which is to be implemented when one of the posterior unit blocks D1 to D3 becomes unable to perform processing during the implementation of the normal transport mode G1. In the transport mode G3, wafers W which have undergone processing in the anterior unit blocks B1 to B3 are distributed to usable ones of the posterior unit blocks D1 to D3. FIG. 14 shows a wafer transport route to be employed when the posterior unit block D1 becomes unable to perform processing as in the case of FIG. 12. Wafers W are transported in the same manner as in the transport mode F3 except that the wafers are developed in the anterior unit blocks B4 to B6 instead of the posterior unit blocks D4 to D6.

Switching of transport mode from the transport mode F1 or G1 is performed automatically during processing of wafers W. However, it is also possible for the user to instruct the control section 51 on switching to the transport mode F2, F3, G2 or G3 by selecting, e.g. via the setting section 57, a unit block to which transport of wafers W is to be stopped. As described above, the user can perform maintenance on the stopped unit block.

Though in the above-described cases transport of wafers W is stopped to one of unit blocks which are tripled and have the same construction, it is also possible stop wafer transport to two of unit blocks having the same construction. Further, the modes F2 and F3 may be implemented in combination, and the modes G2 and G3 may be implemented in combination. Thus, it is possible to simultaneously stop transport of wafers W to one or two of the anterior unit blocks B1 to B3 and to one or two of the posterior unit blocks D1 to D3.

In the coating and developing apparatus 1, it is possible to stop transport of wafers W to particular unit blocks based on the results of inspection of wafers W in the inspection module 31. In particular, when an abnormality is detected in a wafer W, the control section 51 stores the abnormality-related inspection item, the ID of the wafer W and the transport route, in their relation, in the memory 55 as an inspection history. The control section 51, based on the past inspection histories of wafers W stored in the memory, determines whether an abnormality has been detected for the same inspection item and in a predetermined proportion of wafers W which have passed through the same unit blocks that the first defective wafer W has passed through.

Processing of wafers W is continued if it is determined that the proportion of wafers W in which an abnormality has been detected is less than the predetermined proportion. If it is determined that the proportion of wafers W in which an abnormality has been detected is not less than the predetermined proportion, the control section 51 determines to stop transport of wafers W to the unit blocks. The control section 51 then controls the operation of the transfer arms and the interface arms so that wafers W are distributed to the unit blocks of the same type as and other than a unit block to which transport of wafers is stopped. Thus, processing of wafers W is continued with the use of the unit blocks other than the unit blocks to which transport of wafers is stopped. Further, the control section 51 stops the operation of the processing modules and the main arm of a unit block to which transport of wafers is stopped, so that the user can perform inspection or maintenance on the unit block.

In the case of sopping wafer transport to particular unit blocks based on the results of inspection of wafers W as described above, unlike the above-described transport modes F2, F3, G3, G4, wafer transport is stopped to all the unit blocks that wafers W having an abnormality have passed through. Thus, wafer transport is stopped to those ones of the unit blocks B1 to B3, D1 to D3, B4 to B6 and D4 to D6 which wafers W having an abnormality have passed through.

In the coating and developing apparatus 1, it is also possible to stop transport of wafers W to particular processing modules. In particular, when an abnormality is detected in a wafer W, the control section 51 stores the inspection history in the memory 55 as described above. The control section 51, based on the past inspection histories of wafers W stored in the memory, determines whether an abnormality has been detected for the same inspection item and in a predetermined proportion of wafers W which have passed through the same processing modules that the first defective wafer W has passed through. If the criterion is met, the control section 51 stops transport of wafers W to the processing modules. Thus, in a unit block, wafers W are transported to the processing module of the same type as and other than a processing module to which transport of wafers is stopped, and transport of wafers W in the unit block is continued. However, with reference to a liquid processing module with the reference symbol BCT, COT, TCT or BST, one module is provide in each unit block. Therefore, when the stop of wafer transport to such a liquid processing module is determined, transport of wafers W to the unit block including the liquid processing module is stopped. The user can select via the setting section 57 whether to stop transport of wafers W to unit blocks or processing modules.

The coating and developing apparatus 1 has the following constructional features: a stack of the three anterior unit blocks B1 to B3 is provided for performing processing (early-stage film-forming processing) to form a lower antireflection film and a resist film on a wafer W; a stack of the posterior unit blocks D1 to D3 is provided for performing processing (later-stage film-forming processing) to form an upper film on the resist film; the stacks are anteroposteriorly coupled, and the transfer modules (CPL31 to CPL33) are provided for transfer of a wafer W between the anterior unit blocks (B1 to B3) and the corresponding posterior unit blocks (D1 to D3); and the transfer arm 40 is provided which is capable of transferring a wafer W between transfer modules of different layers (heights). Owing to such apparatus construction, even when one of the anterior unit blocks B1 to B3 becomes unusable e.g. due to a failure or maintenance, it is possible to process wafers W in usable anterior unit blocks, and to distribute the wafers W after processing to the posterior unit blocks D1 to D3. Further, even when one of the posterior unit blocks D1 to D3 becomes unusable e.g. due to a failure or maintenance, it is possible to process wafers W in the anterior unit blocks B1 to B3, and to distribute the wafers W after processing to usable ones of the posterior unit blocks D1 to D3. The lowering of the throughput can therefore be reduced. Further, in the coating and developing apparatus 1, the anterior unit blocks B4 to B6 for performing developing processing are stacked on the stack of the anterior unit blocks B1 to B3, and the posterior unit blocks D4 to B6 for performing developing processing are stacked on the stack of the posterior unit blocks D1 to D3. This enables small installation area of the apparatus with a reduced length from the carrier block S1 to the interface block S3.

Furthermore, the coating and developing apparatus 1 can selectively perform negative development and positive development. The apparatus 1 can therefore lower the cost and reduce the apparatus installation area in a factory as compared to the case of separately providing coating and developing apparatuses for performing negative development and positive development, respectively. The exposure pattern in the transport mode F1, F2 or F3, shown in FIGS. 8 and 9, is merely an example. Thus, instead of performing exposure before and after the rotation of a wafer W as described above, it is possible to perform exposure by allowing the exposure head 63 to scan a wafer W only once.

In the coating and developing apparatus 1, the shelf units U8 to U12 of the posterior unit blocks D1 to D3 may each be provided with an inspection module and a peripheral exposure module WEE for performing peripheral exposure of a substrate W after resist coating, in addition to the heating module 33. In that case, a wafer W which has been carried into each of the posterior unit blocks D1 to D3 is transported in the order of: the peripheral exposure module WEE→ the inspection module→ one of the protective film-forming modules TCT1 to TCT3.

In the inspection module, a wafer W is inspected e.g. for the presence or absence of foreign matter on the surface of a resist film and the thickness of the resist film. When an abnormality is detected in a wafer W, wafer transport to unit blocks or processing blocks which have processed the wafer W can be stopped as described above. It is also possible to transport a wafer W in each of the posterior unit blocks D1 to D3 in the order of: one of the protective film-forming modules TCT1 to TCT3→ the heating module 33→ the inspection module, and to inspect a wafer W after the formation of a protective film for foreign matter and the thickness of each film. Also in that case, when an abnormality is detected in a wafer W, the control section 51 makes the above-described determination based on the transport schedule and, if the criterion is met, stops transport of wafers W to processing modules or unit blocks that the defective wafer W has passed through.

With reference to the liquid processing modules with the reference symbols BCT, COT, TCT, BST, DEV, wafer transport may be stopped to an individual processing cup when stopping wafer transport to such processing modules based on the inspection results of one of the above-described inspection modules. Thus, transport of wafers W to the processing cup 23 of a processing module which has processed a wafer W in which an abnormality has occurred is stopped, whereas transport of wafers W to the processing cup 23 which shares a nozzle 24 with the stopped processing cup 23 may be continued. In the case of thus stopping transport of wafers W to an individual processing cup 23, in order to adjust the number of wafers W to be processed in the apparatus, the apparatus may be operated in the following manner: For example, when nonuse of one processing cup 23 of one antireflection film-forming module (e.g. BCT1) is determined, it is possible to set the apparatus not to use one processing cup 23 of one resist film-forming module (e.g. COT1) which lies in the same unit block. Similarly, when nonuse of one processing cup 23 of one resist film film-forming module (e.g. COT1) is determined, it is possible to set the apparatus not to use one processing cup 23 of one antireflection film-forming module (e.g. BCT1) which lies in the same unit block. Further, also in the unit block(s) (e.g. BCT2 and/or BCT3) having the same construction as the unit block in which wafer transport to the one processing cup 23 of the resist film-forming module (e.g. COT1) and to the one processing cup 23 of the antireflection film-forming module (e.g. BCT1) is stopped, it is possible to stop wafer transport to one processing cup 23 of one of the resist film-forming modules and to one processing cup 23 of one of the antireflection film-forming modules in order to adjust the number of wafers W to be processed.

In the coating and developing apparatus 1, instead of the protective-film forming modules TCT1 to TCT3 for forming a protective film overlaying a resist film, it is possible to use upper film-forming modules for forming a different type of film overlaying a resist film, for example, upper antireflection film-forming modules for forming an upper antireflection film. Further, instead of performing hydrophobizing processing in the hydrophobizing modules ADH1 to ADH6 before the formation of an antireflection film in the antireflection film-forming modules BCT1 to BCT3, the hydrophobizing processing may be performed after the formation of an antireflection film and before resist coating, or after resist coating and before transporting wafers W to the posterior unit blocks D1 to D3.

Chemical solutions which have been supplied to wafers W in the liquid processing units 21, 32 are discharged toward a not-shown drainage path provided below the coating and developing apparatus. Chemical solutions which are supplied to wafers W in the antireflection film-forming modules BCT1 to BCT3 and the resist film-forming modules COT1 to COT3 have a high viscosity than a developer. Accordingly, all the chemical solutions can be rapidly discharged by disposing the developing modules DEV1 to DEV6, NTD1 to NTD6 in the upper unit blocks and disposing the other liquid processing modules in the lower unit blocks as in this embodiment. This can prevent vaporization of the chemical solutions in the processing modules, thereby preventing a change in the processing environment in the liquid processing units 21, 32. However, the unit blocks including the developing modules DEV1 to DEV6 and the unit blocks including the negative-tone developing modules NTD1 to NTD6 may be disposed below the unit blocks including the antireflection film-forming modules BCT1 to BCT3 and the resist film-forming modules COT1 to COT3.

Figure 15:
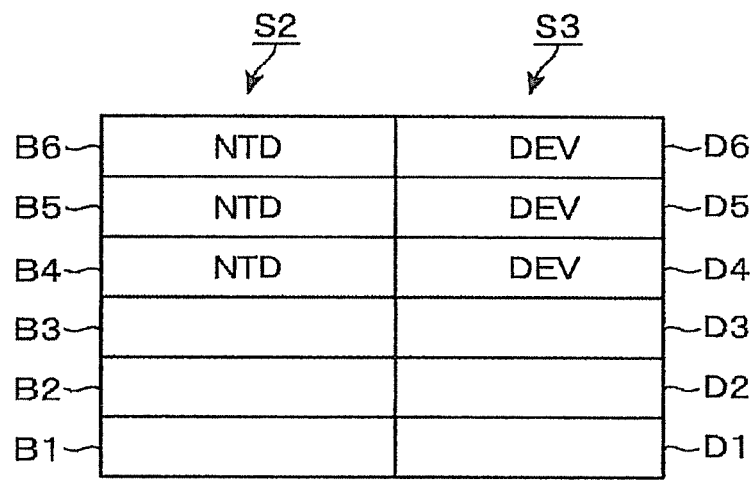
FIG. 15 is a diagram showing the construction of another processing block.
Figure 16:
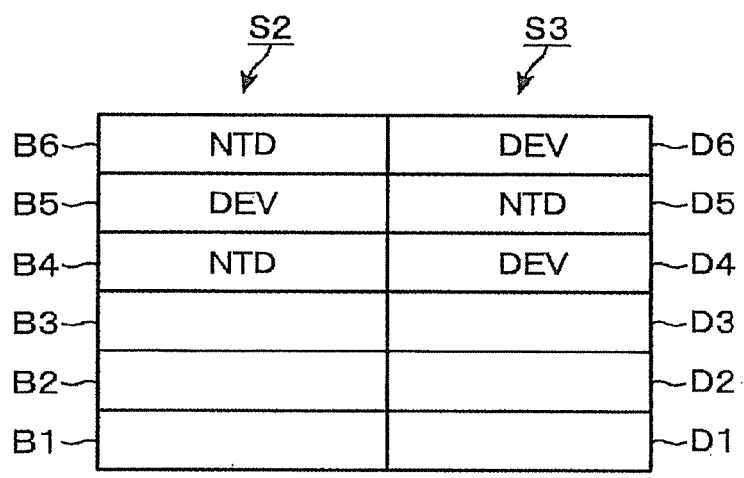
FIG. 16 is a diagram showing the construction of yet another processing block.

As shown in FIG. 15, it is possible to dispose the developing modules DEV in the posterior unit blocks D4 to D6, and to dispose the negative-tone developing modules NTD in the anterior unit blocks B4 to 66. Alternatively, as shown in FIG. 16, the anterior unit blocks 64 to B6 and the posterior unit blocks D4 to D6 both include a developing module(s) DEV and a negative-tone developing module(s) NTD. Alternatively, the liquid processing modules of the unit blocks 64 to 86 and D4 to D6 may be comprised solely of developing modules DEV or developing modules NTD.

Figure 17:
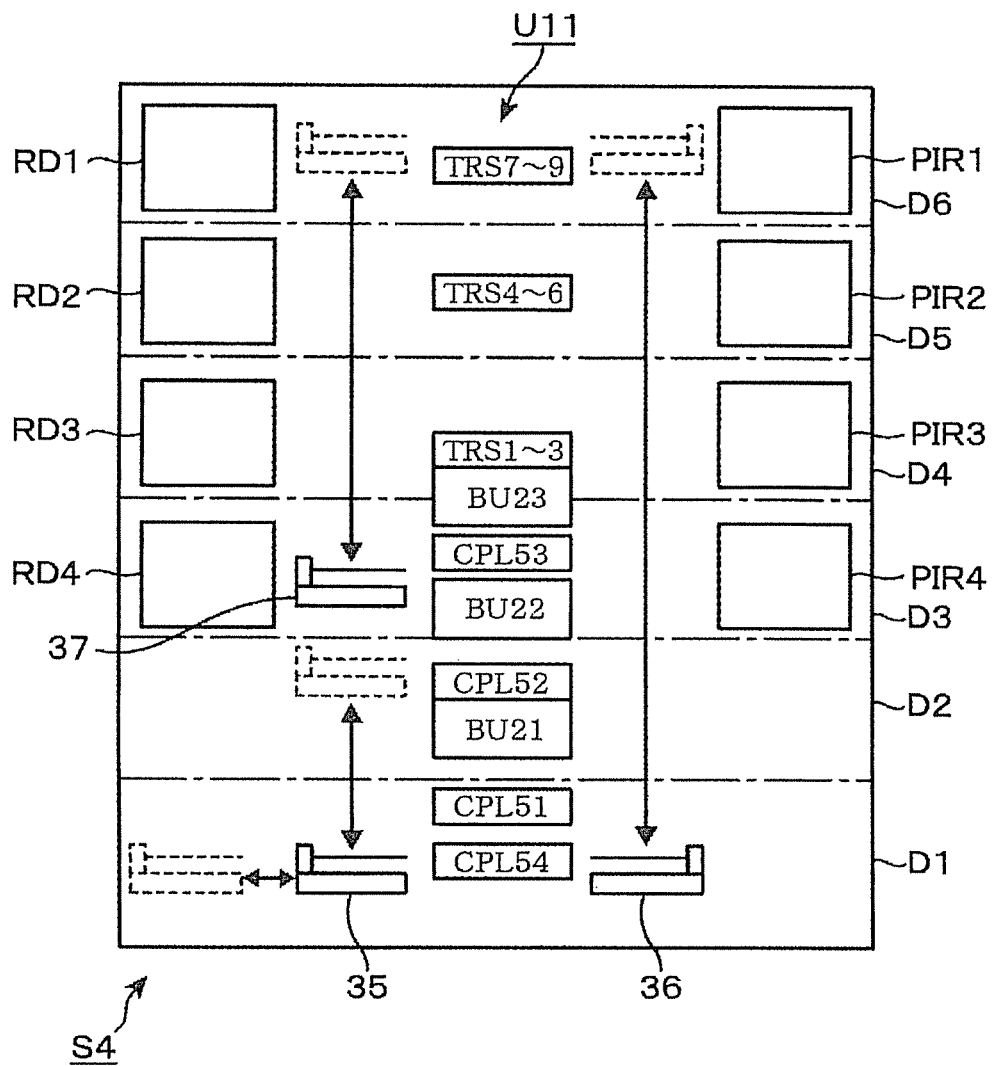
FIG. 17 is a vertical sectional front view of another interface block.

FIG. 17 shows another interface block S4. The interface block S4 of FIG. 17 differs from the interface block S4 shown in FIG. 5 in the provision of a stack of pre-exposure cleaning modules RD1 to RD4 and the provision of an interface arm 37. The pre-exposure cleaning modules RD1 to RD4 supply a cleaning liquid to the surface of a wafer W before exposure to rinse dissolved matter off the surface of the wafer W.

Wafers W which have been processed in the posterior unit blocks D4, D5, D6 and transported respectively to the transfer modules CPL51, CPL52, CPL53, are each transported in the order of: the interface arm 36→ the transfer module BU22→ one of the pre-exposure cleaning modules RD1 to RD4, where the wafer W is subjected to pre-exposure cleaning. Thereafter, the wafer W is transported in the following order: the interface arm 37→ the transfer module BU23→ the interface arm 36→ the transfer module CPL54→ the exposure apparatus S5.

The coating and developing apparatus 1 may be provided with a transport mode H to transport wafers W while bypassing an unusable one of the posterior unit blocks D4 to D6. In the transport mode H, wafer transport is stopped to those ones of the transfer modules of the shelf unit U14 of the interface block S4, which are for transferring wafers W to a unit block which has become unusable. Wafers W which have passed through the usable ones of the posterior unit blocks D4 to D6 and have been transported to the shelf unit U13, are distributed by the transfer arm 40 to the anterior unit blocks B4 to B6.

In particular, upon the occurrence of a failure e.g. in the main arm E4 of the posterior unit block D4, the interface arm 36 stops access to the transfer module TRS1 corresponding to the posterior unit block D4. The interface arm 36 then distributes wafers W after exposure to the transfer modules TRS2, TRS3 corresponding to the posterior unit blocks D5, D6, respectively. The wafers W then pass through the posterior unit blocks D4, D5, and are transported to the transfer modules CPL43, CPL45 of the shelf unit U13.

Of the wafers W which have been transferred to the transfer modules CPL43, CPL45, those wafers W which were set to pass through the posterior unit block D4 are transferred by the transfer arm 40 to the transfer module CPL41, and are then carried into the anterior unit block 134. The other wafers W are carried from the transfer modules CPL43, CPL45 into the anterior unit blocks 135, B6, respectively. Thereafter, the wafers W are returned to the carrier C along the above-described route. During transport through the unit blocks, the wafers W undergo negative development or positive development as in the above-described modes.

The coating and developing apparatus 1 may be provided with a transport mode I to transport wafers W while bypassing an unusable one of the anterior unit blocks B4 to B6. In the transport mode I, of wafers W which have undergone exposure processing and have been transported to the transfer modules CPL41, CPL43, CPL45 of the shelf unit U13 of the posterior unit blocks, those wafers W which have been transferred to a transfer module corresponding to a unit block which has become unusable, are each transported by the transfer arm 40 to another transfer module. The wafers W are then passed through the usable unit blocks of the anterior unit blocks B4 to B6.

In particular, upon the occurrence of a failure e.g. in the main arm A4 of the anterior unit block B4, the transfer arm 40 transports wafers W, which have undergone exposure processing and have been transported to the transfer module CPL 41, alternately to the transfer modules CPL43, CPL45. The wafers W are carried from the transfer modules CPL43, CPL45 into the anterior unit blocks 85, B6, respectively. During transport through the unit blocks, the wafers W undergo negative development or positive development as in the above-described modes. As with the transport mode F2, F3, G1 or G2, the user can arbitrarily switch the normal transport mode F1 or G1 to the transport mode H or I. The transport mode H or I may be implemented simultaneously with the transport mode F2, F3, G1 or G2.

Figure 18:
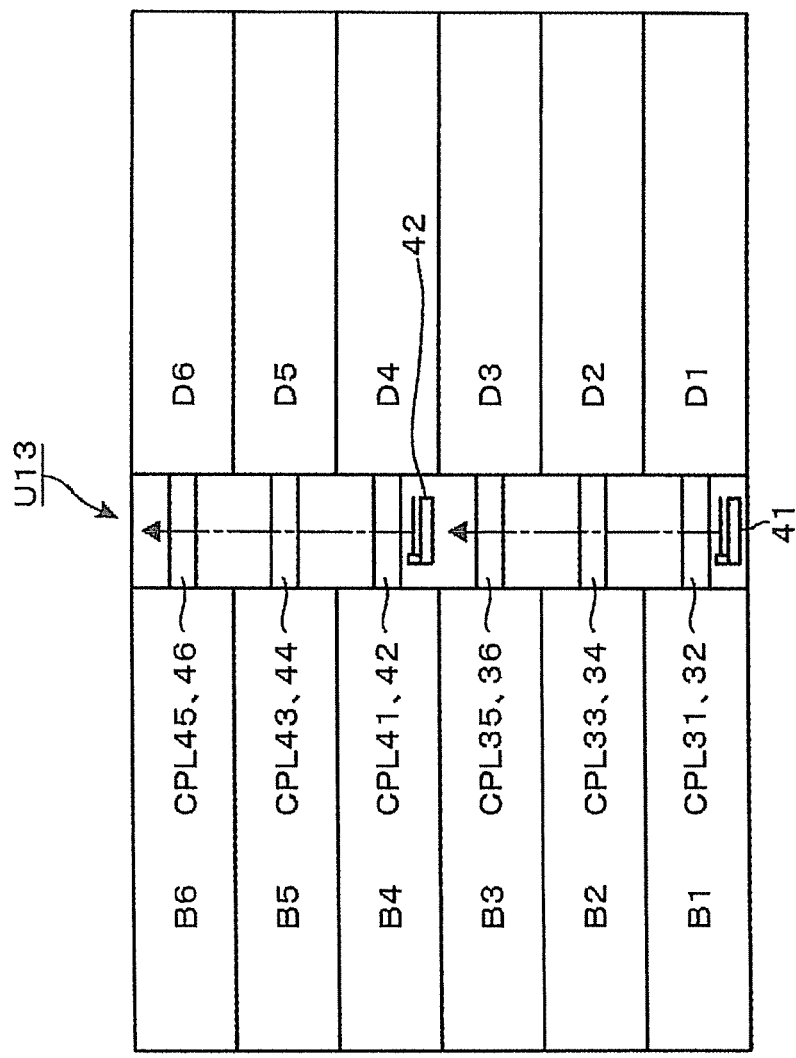
FIG. 18 is a diagram showing the construction of yet another processing block.

As shown in FIG. 18, instead of the transfer arm 40, it is possible to provide a first transfer arm 41 which transports a wafer W between the transfer modules, corresponding to the unit blocks 81 to B3, in the shelf unit U13, and a second transfer arm 42 which transports a wafer W between the transfer modules, corresponding to the unit blocks B4 to 86, in the shelf unit U13. By thus providing the two separate transfer arms 41, 42 which transport a wafer W independent of each other, it becomes possible to reduce the transport load on each arm and increase the throughput.

The invention claimed is:

1. A coating and developing apparatus comprising a carrier block, a processing block, and an interface block connectable to an exposure apparatus, said coating and developing apparatus being configured to transfer a substrate, which has been carried by a carrier into the carrier block, to the processing block, form at least two coating films, including a resist film, on the substrate in the processing block, send the substrate to the exposure apparatus via the interface block, develop the substrate after exposure, which has returned via the interface block, in the processing block, and transfer the substrate to the carrier block, wherein:

the processing block includes a plurality of early-stage processing unit blocks vertically stacked on each other, a plurality of later-stage processing unit blocks vertically stacked on each other and provided on an interface block side of a stack of the early-stage processing unit blocks such that each of the later-stage processing unit blocks is disposed laterally adjacent to respective ones of the early-stage processing unit blocks, a plurality of first developing unit blocks vertically stacked on each other and vertically stacked on the stack of the early-stage processing unit blocks, and a plurality of second developing unit blocks vertically stacked on each other and vertically stacked on a stack of the later-stage processing unit blocks such that each of the second developing unit blocks is disposed laterally adjacent to respective ones of the first developing unit blocks;

each of the early-stage processing unit blocks has a plurality of processing modules, including an antireflection film-forming module as a liquid processing module for forming a lower antireflection film, a resist film-forming module as a liquid processing module for forming a resist film on the lower antireflection film, and heating modules for heating the substrate, and is provided with a transport mechanism that moves on a linear transport passage, extending from the carrier block side to the interface block side, to transport the substrate between the processing modules;

each of the later-stage processing unit blocks has a plurality of processing modules, including an upper film-forming module as a liquid processing module for forming an upper film on the resist film, a cleaning module for cleaning the substrate before exposure, and heating modules for heating the substrate, and is provided with a transport mechanism that moves on a linear transport passage, extending from the carrier block side to the interface block side, to transport the substrate between the processing modules;

each of the first developing unit blocks has a plurality of processing modules, including developing modules for supplying a developer to the substrate, and heating modules for heating the substrate, and is provided with a transport mechanism that moves on a linear transport passage, extending from the carrier block side to the interface block side, to transport the substrate between the processing modules;

each of the second developing unit blocks has a plurality of processing modules, including developing modules for supplying a developer to the substrate, and heating modules for heating the substrate, and is provided with a transport mechanism that moves on a linear transport passage, extending from the carrier block side to the interface block side, to transport the substrate between the processing modules;

said coating and developing apparatus further includes:

a plurality of first transfer units, each of which is disposed between the laterally adjacent early-stage processing unit block and later-stage processing unit block to transfer a substrate therebetween;

a plurality of second transfer units, each of which is disposed between the laterally adjacent first and second developing unit blocks to transfer a substrate therebetween;

a vertically movable auxiliary transfer mechanism for transferring a substrate between the first transfer units and between the second transfer units;

a plurality of third transfer units, each of which is provided on the carrier block side of respective ones of the early-stage processing unit blocks and the first developing unit blocks, for transferring a substrate to the transport mechanism of the associated early-stage processing unit block or for transferring a substrate from the transport mechanism of the associated first developing unit block;

a first transfer mechanism for transferring a substrate to distribute substrates from the carrier to the third transfer units associated with the early-stage processing unit blocks, and for transferring a substrate to return substrates from third transfer units associated with the developing unit blocks to the carrier; and a second transfer mechanism for receiving a substrate before exposure which has been processed in the processing block, and for transferring a substrate to distribute substrates after exposure to the second developing unit blocks.

2. The coating and developing apparatus according to claim 1, wherein the cleaning module is provided with a mechanism, which is configured to clean a back surface of a substrate after the formation of a resist film.

3. The coating and developing apparatus according to claim 1, wherein the first developing unit blocks are unit blocks for performing positive development, and the second developing unit blocks are unit blocks for performing negative development.

4. The coating and developing apparatus according to claim 1, wherein the first developing unit blocks include a unit block for performing positive development and a unit block for performing negative development, and the second developing unit blocks include a unit block for performing positive development and a unit block for performing negative development.

5. The coating and developing apparatus according to claim 1, further comprising a control section which is configured to implement, upon occurrence of a failure in a particular early-stage processing unit block or upon maintenance on it, a transport mode comprising: forming a lower antireflection film and a resist film on a substrate by using the early-stage processing unit block other than the particular early-stage processing unit block; and thereafter transporting the substrate by the auxiliary transfer mechanism to the later-stage processing unit block disposed laterally adjacent to the particular early-stage processing unit block.

6. The coating and developing apparatus according to claim 1, further comprising a control section which is configured to implement, upon occurrence of a failure in a particular later-stage processing unit block or upon maintenance on it, a transport mode comprising: forming a lower antireflection film and a resist film on a substrate in the early-stage processing unit block disposed laterally adjacent to the particular later-stage processing unit block; and thereafter transporting the substrate by the auxiliary transfer mechanism to the later-stage processing unit block other than the particular later-stage processing unit block.

7. The coating and developing apparatus according to claim 1, wherein the number of the vertically-stacked early-stage processing unit blocks is three, and the number of the vertically-stacked later-stage processing unit blocks is three.

8. The coating and developing apparatus according to claim 1, wherein the number of the vertically-stacked first developing unit blocks is three, and the number of the vertically-stacked second developing unit blocks is three.

9. The coating and developing apparatus according to claim 1, wherein the auxiliary transfer mechanism comprises a first auxiliary transfer device for transporting a substrate between the first transfer units at different heights, and a second auxiliary transfer device for transporting a substrate between the second transfer units at different heights.

10. A coating and developing method, to be carried out by using the coating and developing apparatus according to claim 1, upon occurrence of failure in a particular one of the early-stage processing unit blocks or upon maintenance on it, said method comprising:

forming a lower antireflection film and a resist film on a substrate by the early-stage processing unit block other than the particular early-stage processing unit block;

subsequently transporting the substrate by the auxiliary transfer mechanism to the later-stage processing unit blocks disposed laterally adjacent to the particular early-stage processing unit block; and subsequently forming an upper film on the substrate and cleaning the substrate in the later-stage processing unit block to which the substrate is transported.

11. A coating and developing method, to be carried out by using the coating and developing apparatus according to claim 1, upon occurrence of failure in a particular one of the later-stage processing unit blocks or upon maintenance on it, said method comprising:

forming a lower antireflection film and a resist film on a substrate in the early-stage processing unit block disposed laterally adjacent to the particular later-stage processing unit block;

subsequently transporting the substrate by the auxiliary transfer mechanism to the later-stage processing unit block other than the particular later-stage processing unit block; and subsequently forming an upper film on the substrate and cleaning the substrate in the later-stage processing unit block to which the substrate is transported.

12. A non-transitory storage medium in which a computer program for use in a coating and developing apparatus is stored, said computer program being for executing the coating and developing method according to claim 10.

13. A non-transitory storage medium in which a computer program for use in a coating and developing apparatus is stored, said computer program being for executing the coating and developing method according to claim 11.

* * * * *